(12) United States Patent
Arend et al.

(10) Patent No.: US 7,423,254 B2
(45) Date of Patent: Sep. 9, 2008

(54) HIGH RESPONSIVITY HIGH BANDWIDTH METAL-SEMICONDUCTOR-METAL OPTOELECTRONIC DEVICE

(75) Inventors: Mark Arend, New York, NY (US); David Crouse, New York, NY (US)

(73) Assignee: Research Foundation of the City University of New York, New York, NY (US)

( * ) Notice: Subject to any disclaimer, the term of this patent is extended or adjusted under 35 U.S.C. 154(b) by 0 days.

(21) Appl. No.: 10/593,930

(22) PCT Filed: Mar. 22, 2005

(86) PCT No.: PCT/US2005/009383

§ 371 (c)(1),
(2), (4) Date: Oct. 31, 2006

(87) PCT Pub. No.: WO2005/092037

PCT Pub. Date: Oct. 6, 2005

(65) Prior Publication Data

US 2007/0235635 A1    Oct. 11, 2007

Related U.S. Application Data

(60) Provisional application No. 60/555,109, filed on Mar. 22, 2004.

(51) Int. Cl.
*H01L 31/00* (2006.01)
(52) U.S. Cl. .............................. 250/214.1; 250/214 R; 257/189; 257/448; 257/457; 385/40
(58) Field of Classification Search .............. 250/214.1, 250/214 R; 257/184, 189, 441–444, 448, 257/449, 457–459; 385/1, 2, 3, 14, 39, 40, 385/129, 130, 131
See application file for complete search history.

(56) References Cited

U.S. PATENT DOCUMENTS 5,625,729 A    4/1997    Brown (Continued)

OTHER PUBLICATIONS

Degiron et al., "Effects of Hole Depth on Enhanced Light Transmission Through Subwavelength Hole Arrays", *Applied Physics Letter*, vol. 81, No. 23 pp. 4327-4329 Dec. 2, 2002.

(Continued)

*Primary Examiner*—Georgia Y. Epps
*Assistant Examiner*—Francis M Legasse, Jr.
(74) *Attorney, Agent, or Firm*—Hoffmann & Baron, LLP; Irving N. Feit

(57) ABSTRACT

An optical device for sensing an incident optical wave within a wavelength range includes a first array and a second array of electrodes superposed on a substrate, and a sensor connected to the contacts. The arrays are interdigitated. Each array includes its own parameters: contact width, contact thickness, groove width, and a groove dielectric constant. A structure associated with the arrays resonantly couples the incident wave and a local electromagnetic resonance or hybrid mode including at least a surface plasmon cavity mode (CM). For coupling the CM, an aspect ratio of contact thickness to spacing between electrodes is at least 1. A preferred structure for coupling a hybrid mode for high bandwidth and responsivity includes a higher dielectric constant in alternating grooves. The substrate may include silicon, including silicon-on-insulator (SOI). An SOI device having a alternating grooves with a higher dielectric, e.g., silicon oxide, provides 0.25 A/W and 30 GHz bandwidth.

31 Claims, 13 Drawing Sheets

U.S. PATENT DOCUMENTS

| | | | |
|---|---|---|---|
| 5,945,720 | A | 8/1999 | Itatani et al. |
| 5,973,316 | A | 10/1999 | Ebbesen et al. |
| 6,034,809 | A | 3/2000 | Anemogiannis |
| 6,122,091 | A | 9/2000 | Russell et al. |
| 6,236,033 | B1 | 5/2001 | Ebbesen et al. |
| 6,282,005 | B1 | 8/2001 | Thompson et al. |
| 6,285,020 | B1 | 9/2001 | Kim et al. |
| 6,441,298 | B1 | 8/2002 | Thio |
| 6,614,960 | B2 | 9/2003 | Berini |
| 6,713,832 | B2 | 3/2004 | Pardo et al. |

OTHER PUBLICATIONS

Ebbesen et al., "Extraordinary Optical Transmission Through Sub-Wavelength Hole Arrays", *Nature*, vol. 39, pp. 667-669, Feb. 12, 1998.

Lochbihler et al., "Highly Conducting Wire Gratings in the Resonance Region", *Applied Optics*, vol. 32, No. 19, pp. 3459-3465, Jul. 1, 1993.

Dmitruk et al., "MSM-Photodetectors with Corrugated Metal-Semiconductor Interface Based on III-V Semiconductors", *SPIE*, vol. 2999, pp. 384-390, Jan. 2, 1997.

Krishnaswami et al., "A Comparative Study of Surface Plasma Enhanced Grating Coupled Detectors", *SPIE*, vol. 2999, pp. 391-400, Jan. 2, 1997.

— Reflectance
- - - - 0th Order Trans.
++++++ 1st Order Si Diff.

— Reflectance
- - - 0th Order Trans.
ooooo 1st Order Si Diff.
+++++ 2nd Order Si Diff.

HIGH RESPONSIVITY HIGH BANDWIDTH METAL-SEMICONDUCTOR-METAL OPTOELECTRONIC DEVICE

This application claims the benefit of U.S. Provisional Application No. 60/555,109 filed on Mar. 22, 2004, which is incorporated herein by reference.

FIELD OF THE INVENTION

The invention relates to the field of high responsivity optoelectronic devices and more particularly to high bandwidth, high sensitivity metal-semiconductor-metal photodetectors.

BACKGROUND

In prior art metal-semiconductor-metal (MSM) detectors, as light of an energy sufficiently larger than the bandgap of the semiconductor is incident on the structure, some of the incident light impinges on the semiconductor between the electrodes and excites charge carriers, i.e. electrons and holes, in the semiconductor. The electrons are swept by the applied voltage and electric field toward positively charged electrodes. The holes are swept in the opposite direction towards the negatively charged electrodes. As the charge carriers are swept to the electrodes, or contacts, they induce a measurable electrical current in the contacts.

The speed of the MSM device is generally limited by the time necessary for charges to be swept to the electrodes. One method to increase the speed of these MSM devices has been to reduce the spacing between adjacent electrodes. The reduced spacing shortens the distance the carriers have to travel to the electrodes, therefore decreasing the transit time. The decreased transit time results in increased speed of the device. This increased speed is an advantage of MSM devices over other types of detectors. By reducing the spacing while maintaining a constant contact spacing, however, a large percentage of the surface of the device is covered with metallic reflective electrodes that reflect the incident light, resulting in lower sensitivity. Consequently, light sensitivity is sacrificed for high speed in typical MSM devices.

The multiple electrode configuration in an MSM device may form a grating-like structure. The transmission of light through closely spaced gratings has been a subject studied by researchers in the past. In particular, surface plasmons (SPs) and other electromagnetic resonances (ER) exhibiting dramatic optical behavior have been observed and analyzed in lamellar gratings and other periodic compound grating structures. Research into the phenomenon of "anomalous" transmission and electromagnetic resonances in periodic structures increased after Ebbesen et al. reported that a two-dimensional array of holes can transmit a higher proportion of light at certain wavelengths and angles of incident than the ratio of the area of the holes relative to the total area of the film, in Ebbesen, T. W., et al., "Extraordinary Optical Transmission Through Sub-Wavelength Hole Arrays," *Nature*, 391: pp. 667-669 (1998). In other words, the incident light seems to be "channeled" through the holes. Anomalous transmission has also been observed in 1D periodic grating structures, for example, in Lochbihler, H., "Surface Polaritons on Gold-Wire Gratings," *Physical Review B*, 50(7): p. 4795 (1994). These and other researchers have been primarily interested in the physical mechanisms of anomalous transmission, without examining the practical applications of surface plasmons to electro-optical devices, for example, with a few noteworthy exceptions.

For example, U.S. Pat. No. 5,973,316 to Ebbesen et al., discloses an array of subwavelength apertures in a metallic film or thin metal plate for enhanced light transmission by coupling to an SP mode, where the period of the array is chosen to enhance transmission within a particular wavelength range. The array may be used to filter and collect light for photolithographic applications.

In another example, U.S. Pat. No. 5,625,729 to Brown, discloses an optoelectronic device for resonantly coupling incident radiation to a local surface plasmon wave. The device includes a multiplicity of substantially planar and regularly spaced low-profile electrodes, which forms a grating, on a semiconductor substrate to resonantly couple a surface plasmon mode propagating along the grating and the substrate (horizontal SP mode).

The Brown patent, therefore, extends the known coupling effect of horizontal SPs on flat grated interfaces to the periodic metal gratings that make up a conventional MSM photodetector. Though the MSM photodetector described in the Brown patent may enhance the transmission through the electrode grating, only one electrode structure (a flat, low-profile grating structure) of the MSM photodetector for coupling one type of SP mode (horizontal) is disclosed and considered, regardless of the semiconductor material used in the MSM photodetector or of the use thereof. In other words, the MSM photodetector of the Brown patent has not been optimized for the most efficient use of SP mode coupling or any other ER mode coupling for a particular detector application.

There is a need, therefore, for an improved metal-semiconductor-metal device that is optimized for both fast response time (high bandwidth) and high responsivity for a particular application, which requires, inter alia, a particular wavelength range of detection.

SUMMARY OF THE INVENTION

The present invention relates to a high-bandwidth, high-responsivity metal-semiconductor-metal (MSM) device optimized for a particular application and range of wavelength sensitivity.

One embodiment of the present invention relates to an optical detector for sensing the strength of an external optical wave. The detector includes a multiplicity of metal electrodes spaced in a substantially regular pattern, which are adapted to resonantly couple between the external optical wave and a local optical wave and to allow a potential difference between adjacent electrodes. The detector further includes a structure associated with the multiplicity of electrodes, wherein the structure and the multiplicity of electrodes support the local wave, and a sensor connected to the multiplicity of electrodes for sensing an electrical quantity.

The optical detector additionally includes a semiconductor substrate in superposed relationship with the multiplicity of electrodes, and an aspect ratio of a height of the multiplicity of electrodes to a spacing between adjacent electrodes of at least 1. In addition, the local wave being coupled to the external wave includes a surface plasmon wave having a component of momentum oriented substantially perpendicular to a detector surface.

The semiconductor substrate of the optical detector preferably includes mercury cadmium telluride, indium gallium arsenide, or silicon.

In another embodiment, the substrate of the optical detector includes a silicon-on-insulator structure.

The spacing between adjacent electrodes is preferably at least about 20 nanometers.

In one embodiment, the aspect ratio is at least 3.

In another embodiment, the aspect ratio is greater than 4 and less than 16.

In yet another embodiment, the aspect ratio is greater than 10 and less than 15.

The optical detector may also include a second multiplicity of electrodes spaced in a substantially regular pattern rotated 90° in the plane of the detector surface. The second multiplicity of electrodes is in superposed relationship with the multiplicity of electrodes and the substrate. The second multiplicity of electrodes are adapted to resonantly couple between the external optical wave and the surface plasmon wave, which has a component of momentum oriented substantially perpendicular to the detector surface.

In another embodiment, the optical detector may include a semiconductor layer substantially filling the spacing between adjacent electrodes.

In still another embodiment, the height of the multiplicity of electrodes of the optical detector is at least about 50 nanometers.

In yet another embodiment, the height of the multiplicity of electrodes is substantially in a range of about 50 nanometers to about 1500 nanometers.

In a different embodiment, the height of the multiplicity of electrodes is substantially in a range of about 100 nanometers to about 750 nanometers.

The present invention also relates to an optical device for sensing the strength of an incident optical wave within a wavelength range, which includes a first array of first electrodes, a second array of second electrodes, a substrate, and a sensor connected to the first electrodes and the second electrodes for sensing an electrical quantity. The second array is linearly displaced relative to the first array, so that the second electrodes are interdigitated with the first electrodes. The device also includes a structure associated with the first array and the second array for resonantly coupling between the incident optical wave and a local electromagnetic resonance. The local electromagnetic resonance includes at least a cavity mode of a local surface plasmon wave. The first and second array are in superposed relationship with the substrate. In addition, the first array includes a first contact window with a first width, a first contact window dielectric having a first dielectric constant, a first contact thickness and a first contact width, while the second array includes a second contact window with a second width, a second contact window dielectric having a second dielectric constant, a second contact thickness and a second contact width. The device also includes a pitch of the electrode structure.

The substrate of the optical device preferably includes one of an elemental IV semiconductor, a III-V semiconductor, and a II-VI semiconductor.

In one embodiment, the semiconductor includes one of mercury cadmium telluride, indium gallium arsenide, and silicon.

At least one of the first electrodes and the second electrodes may include gold.

In one embodiment of an optical device wherein the substrate includes mercury cadmium telluride, the first electrodes and the second electrodes include aluminum, and the first dielectric constant is greater than the second dielectric constant. In addition, the first dielectric constant is preferably in a range of from 1.75 to 4.0.

The structure of the mercury cadmium telluride optical device preferably resonantly couples with a hybrid mode. The hybrid mode includes at least the cavity mode and a horizontal surface plasmon mode. The device operates within a wavelength range from at least about 2.0 micrometers to about 4.0 micrometers.

In another embodiment of the mercury cadmium telluride optical device, the structure resonantly couples with a hybrid mode for a wavelength range from at least about 4.0 micrometers to about 15.0 micrometers. In addition, each of the first and the second width is in a range of from 0.5 micrometers to 0.9 micrometers. Each of the first and the second contact thickness is in a range of from 0.45 micrometers to 0.85 micrometers. Each of the first and the second contact width is in a range of from 0.2 micrometers to 0.5 micrometers.

An embodiment of the optical device wherein the substrate includes silicon, provides a structure resonantly coupling with a hybrid mode, which includes at least the cavity mode and a horizontal surface plasmon mode. The wavelength range includes a range from about 830 nanometers to at least about 850 nanometers. In addition, each of the first contact width and the second contact width is greater than each of the first width and the second width.

Preferably, the first dielectric constant of the optical device having a silicon substrate is greater than the second dielectric constant, wherein the first dielectric constant is in a range of from 1.75 to 4.0. In addition, at least one of the first contact thickness and the second contact thickness is preferably at least 100 nanometers.

In addition, each of the first width and the second width may be within a range of from 0.075 micrometers to 0.25 micrometers.

Also, each of the first contact thickness and the second contact thickness may be within a range of from 0.075 micrometers to 0.2 micrometers.

In another embodiment of the optical device, the substrate includes a silicon-on-insulator structure. Preferably, this optical device has a bandwidth greater than 30 GHz and a responsivity of at least 0.25 A/W.

The second dielectric of the optical device including the silicon-on-insulator structure may include silicon oxide. Additionally, the first contact width is preferably at least twice the first width, and each of the first thickness and the second thickness is at least 100 nm.

The silicon-on-insulator structure includes a top silicon layer and an insulator layer. Preferably, the top silicon layer has a thickness within a range of from 300 nanometers to 400 nanometers and the insulator layer has a thickness-within a range from 25 nanometers to 75 nanometers.

As a result, the present invention provides a high-bandwidth, high-responsivity metal-semiconductor-metal device, which is optimized for a particular operating wavelength range.

BRIEF DESCRIPTION OF THE DRAWINGS

FIG. 1$b$ is a cross-section through a portion of an MSM detector, with a simulated magnetic field intensity for the $1^{st}$ order vertical surface plasmon or cavity mode (CM) superimposed thereon.

FIG. 19b is a plot of the Poynting vector for the device of FIG. 19a.

DETAILED DESCRIPTION

Figure 1A:
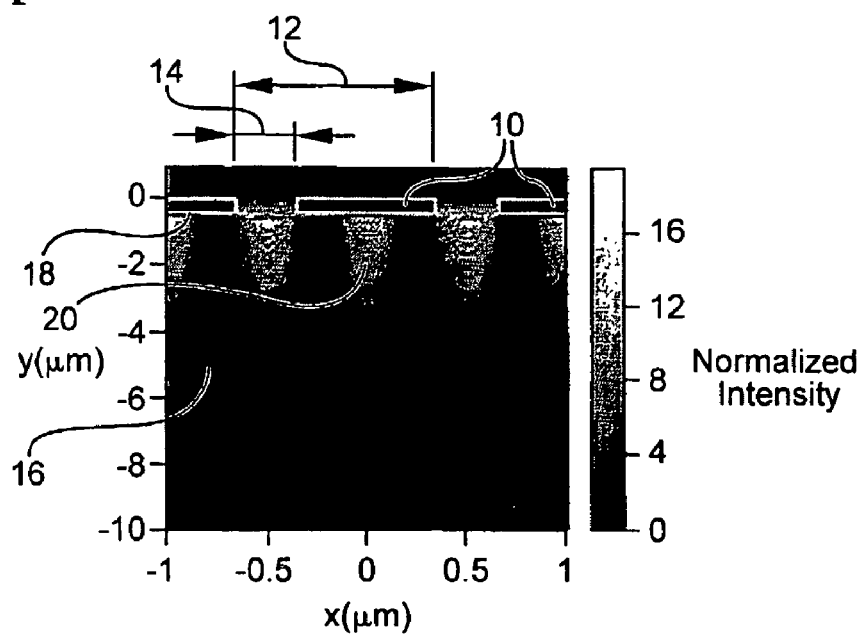
FIG. 1$a$ is a cross-section through a portion of a metal-semiconductor-metal (MSM) detector, with a simulated magnetic field intensity for the $1^{st}$ order horizontal surface plasmon (HSP) mode superimposed thereon.

The device formed in accordance with the present invention provides an optoelectronic device with a fast response time and a high sensitivity. The structure of the device is specially tailored for optimum performance depending on the application. In particular, different applications require a sensitivity of detection within a specific wavelength range. This requirement limits the preferred semiconductor materials to those exhibiting a higher responsivity in the wavelength range of interest. Conventional devices that utilize these same semiconductors, however, do not necessarily also exhibit optimum response times, so that optoelectronic device designers must often sacrifice responsivity in exchange for higher speed.

In the present invention, the device offers high responsivity within a preferred wavelength range, while also providing high speed response times, by tailoring the structure of the electrodes to enhance both device response time and absorption of incident radiation by a particular substrate. Preferably, the substrate includes a semiconductor, and the device is characterized as a metal-semiconductor metal (MSM) device. The electrode structure and material properties are optimized for resonantly coupling the incident optical wave and transmitted wave components via local electromagnetic resonances (ER). The local ER mode preferably includes a surface plasmon (SP) wave, which has at least a component of momentum substantially perpendicular to the surface of the device. The perpendicular component of the SP wave is referred to herein as a vertical SP mode or a cavity mode (CM). By varying the structure and material of the electrodes, the electromagnetic field profile induced in the semiconductor by the incident optical signal or wave can be highly controlled. By contrast, prior art devices, which typically include a low profile, regular electrode structure, have been configured only for coupling the horizontal SP (HSP) mode.

The ER modes may also include, e.g., diffracted modes (DM), Wood-Raleigh anomalies (WR), HSPs and CMs.

HSPs are surface plasmon modes that have a momentum parallel to the air/contact and contact/semiconductor interface (in the x̂ direction in FIG. 1). HSPs are localized near dielectric/contact interfaces and have high field intensities, high absorption in the metal wires, and usually produce maxima (minima) in reflectance (transmittance). WRs are the onset of a propagating diffracted mode and also are localized near the air/contact or contact/semiconductor interfaces, but less so than HSPs. WRs do not have as high of field intensity as HSPs and have low absorption in the wires. As the incident wavelength is decreased (energy increased), the WR signifies the point at which power is increasingly being transferred from the 0$^{th}$ incident and reflected modes into diffracted modes, first in Si and at lower wavelengths (higher energies) in air. CMs are vertically oriented surface plasmons on the walls of the grooves with an imposed Fabry-Perot resonance condition produced by the geometry of the groove. CMs have high field intensities within the grooves. It is believed that the enhanced transmission phenomenon is produced by a coupling between propagating modes and WRs in the air and semiconductor via a CM.

Generally, the local ER wave, like any optical wave, can be directionally resolved into orthogonal modes. The complex wave can then be described as a superposition of the ER modes in some linear combination. The complex wave mode is referred to herein as a hybrid mode. The hybrid mode, therefore, may include any combination of ER modes, including, e.g., a DM, W-R mode, HSP and CM. The two basic types of SP modes, namely HSPs and CMs, in MSM and other grating-like structures, are described by the examples shown in FIG. 1a and FIG. 1b, respectively. The figures show a portion of a simulation model for an MSM silicon-based device. In both examples, the electrodes 10, also referred to herein as contacts 10, are 0.5 micrometer (μm) thick aluminum (Al) wires with 1 μm pitch 12, 0.7 μm wire width, 0.3 μm contact window width 14. The contact window 14 is also referred to herein as a "groove." The substrate 16 includes silicon.

Pitch 12 as used herein refers to the distance from an edge of an electrode in a first array to an edge of a next electrode in the first array of electrodes. The pitch, therefore, is equal to a sum of the width of the electrode in the first array and a spacing between adjacent electrodes in the first array. In FIG. 1a, the device has only one array, and the spacing between adjacent electrodes is the contact window width 14; therefore, the pitch is the sum of the contact window width 14 and the electrode width.

Figure 1B:
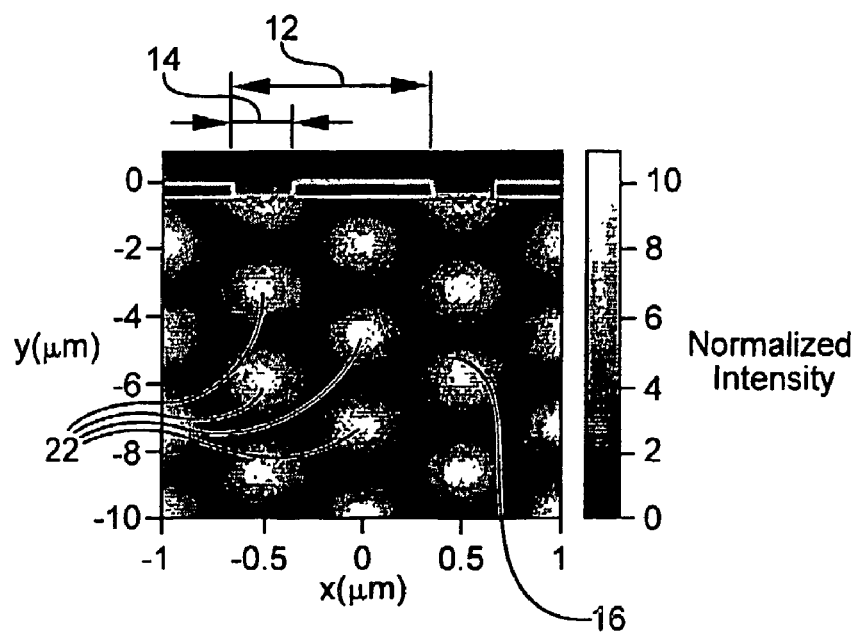

The simulations resulting in the electromagnetic field distributions shown in FIGS. 1a and 1b were performed to demonstrate the effect of the two types of SP modes on device speed. The distribution of FIG. 1a for a $1^{st}$ order HSP mode coupling was simulated for incident radiation at 0.37 eV, which corresponds to about 3.35 μm wavelength. The magnetic field intensity shown in FIG. 1b was simulated for a $1^{st}$ order CM coupling at 0.55 eV, which corresponds to about 2.25 μm wavelength. Both energies are below the bandgap of Si, and thus outside the useable wavelength range for silicon. These representations of CM and HSP modes in a Si-based MSM device, however, can also exist at higher energies within the bandgap.

Referring to FIG. 1a, for HSP mode coupling, the field is confined to the contact 10/semiconductor 16 interface 18, with a strong electromagnetic field intensity 20 directly under the contacts, where the static electric field produced by the applied bias is small. Therefore, photogenerated carriers at these locations will take a long time to drift to their respective contacts, resulting in an increase response time.

Referring to FIG. 1b, for CM coupling, the magnetic field intensity has a large electromagnetic field intensity in the groove 14 for coupling of an incident wave to radiating optical modes 22, which for materials with small absorption constants, such as silicon (Si) ($\alpha=3.82\times10^2$/cm at incident radiation wavelength of 850 nm), would produce large fields deep within the structure. Pure CM coupling, therefore, results in photogenerated carriers at these locations also requiring a long time to drift to their respective contacts. A structure supporting only one type of mode coupling within the wavelength range of interest, therefore, may not be ideally configured for a high performance Si-based MSM device.

Figure 2:
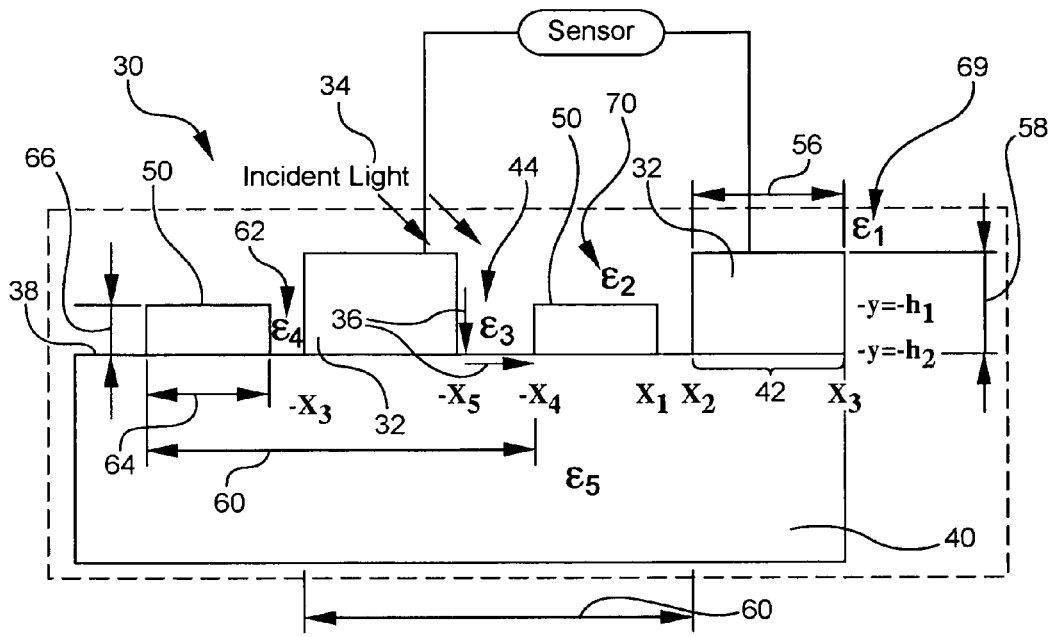
FIG. 2 is a cross-section through a portion of an embodiment of an MSM detector formed in accordance with the present invention.

Referring to FIG. 2, an embodiment of the MSM device 30 of the present invention includes at least one array of electrodes, i.e., at least a first array of electrodes 32. The electrodes 32 are spaced in a substantially regular pattern. The electrodes 32 are adapted to resonantly couple between an external optical wave 34 to be detected and a local ER 36 such as a CM, HSP, a W-R, a diffracted mode, or any combination thereof (hybrid mode). The ER 36 preferably includes at least an SP with a component of momentum oriented substantially perpendicular to a detector surface 38 of the device 30, i.e., the wave 36 includes a surface plasmon cavity mode (CM). The device 30 further includes a substrate 40 in superposed relationship with the at least one array of electrodes 32. The substrate 40 preferably includes a semiconductor material.

In addition, a structure is associated with the at least one array of electrodes 32, wherein the structure supports an ER or hybrid mode, including at least the CM component of the surface plasmon wave. A sensor (not shown) is preferably operatively connected to the electrodes 32 for sensing an electrical quantity.

The detector surface 38 of the device 30 is preferably a substantially planar surface, part of which is directly exposed to the external optical wave 34, and part of which forms an interface 42 between the electrodes 32 and the substrate 40. The detector surface 38 coincides with a surface of the substrate 40. Alternatively, one or more layers of transmissive optical material, e.g., an antireflective coating, may be deposited on the substrate 40 to form the detector surface 38.

The substrate 40 of the MSM detector of the present invention preferably includes a semiconductor.

The semiconductive substrate 40 may include any semiconductor, including but not limited to the following: elemental IV semiconductors, such as silicon (Si); III-V semiconductors, such as gallium arsenide (GaAs) and indium phosphide (InP), and III-V ternary compound semiconductors, such as aluminum gallium arsenide (AlGaAs) and indium gallium arsenide (InGaAs); and II-VI semiconductors, such as mercury cadmium telluride (HgCdTe).

The high-speed, high-sensitivity MSM device formed in accordance with the present invention is particularly useful for detection of incident radiation within the visible to near-infrared spectrum, e.g., from between about 500 nanometers (nm) to about 1600 nm.

In one embodiment of the present invention, the MSM device 30 includes a substrate 40 including silicon. Preferably, the operating wavelength range is from about 830 nm to about 850 nm.

In another embodiment, the substrate 40 includes a silicon-on-insulator structure.

In another embodiment, the silicon-based MSM device of the present invention may be adapted for use in space-based applications.

In another embodiment of the present invention, the substrate 40 includes indium gallium arsenide (InGaAs). Preferably, the operating wavelength range of the device 40 includes the near-infrared, e.g., from about 1000 m to about 1600 nm. Most preferably, the operating range is from about 1200 nm to about 1550 nm.

In another embodiment, the InGaAs MSM device of the present invention may be adapted for use in high-bandwidth communication systems.

A method of designing an optimized MSM detector includes choosing a semiconductor for a particular application, according to the preferred wavelength range of sensitivity and other characteristics relevant to a particular application, such as temperature sensitivity and hygroscopicity, to name a few. The structure of the at least one electrode array 32 is then optimized to produce the optimal electromagnetic field profile depending on the application and preferred wavelength range of operation, as described herein.

The electrodes of the present invention comprise a metal. In addition, the electrodes are characterized by having a potential difference between adjacent electrodes. Preferably, the potential difference between any two adjacent electrodes is achieved by maintaining a positive voltage on one electrode, and a negative voltage on the adjacent electrode(s).

Referring to FIG. 2, the electrodes may be of any shape and are arranged in a preferred geometrical pattern for optimum coupling of the ER modes for a particular application. The preferred structure optimizes the production of ER modes, which preferably include some degree of CM coupling, at a particular wavelength, angle of incidence, and polarization of the incident light. When the light satisfies these parameters, it is largely transmitted through the at least one array of metallic contacts 32 and into the semiconductive substrate 40. The light which channels into the substrate 40 excites electron-hole pairs which are then collected by the contacts 32, preferably registering a photocurrent. Due to the coupling of incident light and transmitted wave components via the vertically oriented surface plasmon CM, the amount of light collected is larger than that which is directly incident on the area of the semiconductor material, i.e., through each contact window 44 not covered by the electrodes 32.

Preferably, the electrodes are substantially rectangular in shape and substantially perpendicular to the detector surface 38. The electrodes are also preferably characterized by a substantially straight perpendicular edge at the substrate 40.

In one embodiment, the edge between the electrodes, e.g., those in the first array 32, and the substrate 40 is characterized as substantially curved or sloped. The substantially sloped edge that can occur in manufacturing does not affect the coupling of surface plasmon, WR or diffracted modes in the substrate 40, but may shift the resonance energy of the modes 36 and must be taken into account in optimizing parameters of a device formed in accordance with the present invention.

Figure 3:
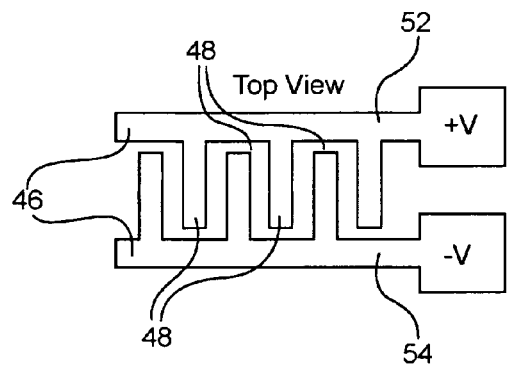
FIG. 3 is a top view of an interdigitated electrode structure of an embodiment of an MSM detector formed in accordance with the present invention.

As shown in FIG. 3, the electrodes are preferably interdigitated metal electrodes 46. The interdigitated electrodes include protruding fingers 48, which form back-to-back Schottky contacts when deposited on the surface of a semiconductor substrate.

Referring both to FIG. 2 and FIG. 3, the electrode structure of the device 30 may be more complex than a conventional MSM device. In one embodiment, the at least one electrode array includes the first array of substantially regularly spaced electrodes 32 and a second array 50 of substantially regularly spaced electrodes. Though only two electrode arrays are shown in FIG. 2, a more complex structure incorporating still more arrays is also contemplated to be within the scope of the present invention. The two arrays in FIG. 2 are interleaved, or interdigitated, preferably using interdigitated electrodes 46, as shown in FIG. 3, to generate an alternating pattern of the first 32 and second electrodes 50. For example, the first array 32 may be represented by the top array of electrodes 52, held at a positive potential, and the second array 50 may be represented by the bottom array 54, held at a negative potential. The electrodes of the first 32 and second array 50 are adapted to resonantly couple between the external optical wave 34 and at least the CM component of the surface plasmon wave 36.

The two arrays may have one or more characteristics that differ from the other. In general, the first array 32 comprises a first metal having a first dielectric constant and is associated with a first width of a first contact window 44, a first contact width 56 and thickness 58, also referred to herein as height 58, and a pitch 60. Analogously, the second array 50 comprises a second metal having a second dielectric constant, and is associated with a second width of a second contact window 62, and a second contact width 64 and thickness 66. The pitch 60 describing the periodicity of the electrode structure can also be defined using the second contacts, as shown. Adjacent electrodes, therefore, may be composed of different materials, and have different widths and thicknesses.

In addition, alternating contact window regions may have different dielectric materials. The device 30 may include a dielectric material, preferably a film, having a dielectric constant $\epsilon_2$ associated with a contact window region 70 extending from one electrode in the first array 32 to the next electrode in the first array 32, and above a height of the electrodes of the second (lower profile) array 50. The device 30 preferably includes a first dielectric material, or first contact (groove) dielectric, having a dielectric constant $\epsilon_3$ associated with the first contact window 44 extending from a trailing edge of one electrode in the first array 32 to an adjacent leading edge of an electrode in the second array 50 (below the height of the electrodes of the lower profile (second) array 50). The device preferably additionally includes a second dielectric material, having a second dielectric constant $\epsilon_4$ associated with the second contact window 62, which extends from a trailing edge of an electrode in the second array 50 to an adjacent leading edge of an electrode in the first array 32. One or more of the dielectric constants associated with the contact window regions may differ.

The contact window region 70 may be air having $\epsilon=1$. Likewise, the region 69 above both dielectrics in one embodiment is air.

In a method according to the present invention, the MSM device 30 is optimized using this large degree of structural variability to produce optimum ER mode coupling to achieve particular electro-optical characteristics by correctly designing the structure.

The method may include applying an extended version of the surface impedance boundary condition (SIBC) method. The SIBC method is well-known to those skilled in the art. An improved extended-SIBC algorithm of the present invention allows for the numerical modeling of the complex structure shown in FIG. 2. The following structural characteristics or asymmetries are thus able to be varied, analyzed, and optimized in modeling the device 30: alternating metal wires composed of different metals; materials with different dielectric constants placed in alternating grooves; alternating metal wires having different widths; alternating metal wires having different thicknesses; and alternating metal wires being offset, i.e., width of contact window 44 does not equal the width of contact window 62 (in FIG. 2 $(x_2-x_1) \neq (-x_5+x_4)$).

Investigations have shown that each one of these asymmetries produce different effects on the ER modes that are useful in the design of high performance photodetectors.

By tailoring the structure with the five asymmetries stated above, electromagnetic fields that are optimal for an ER-enhanced MSM photodetector for a particular application may be obtained. For example, a different optimal structure applies to two types of detectors that are of particular importance in high-bandwidth, high-sensitivity applications: Si-based and InGaAs MSM detectors. To illustrate this "hybridizing" of HSP and CM surface plasmon modes, e.g., a comparison of an HSP mode, CM mode, and hybrid SP mode that combines an HSP and CM mode in $Hg_{0.276}Cd_{0.324}Te$ is shown in FIGS. 4a, 4b, and 4c, respectively.

Figure 4A:
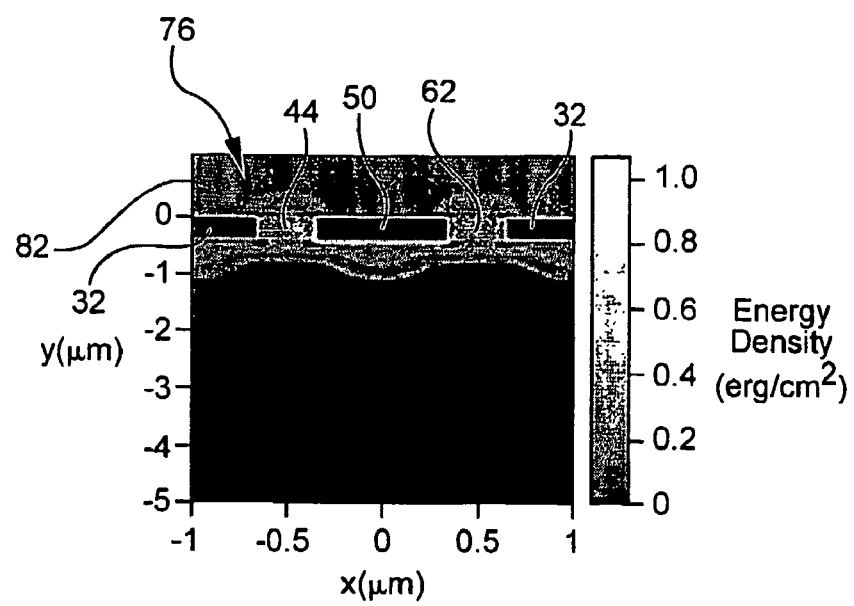
FIG. 4a is a plot of an effective electromagnetic energy density for the 1$^{st}$ order HSP mode at 0.36 eV for an MSM structure including $Hg_{0.276}Cd_{0.324}Te$.
Figure 4B:
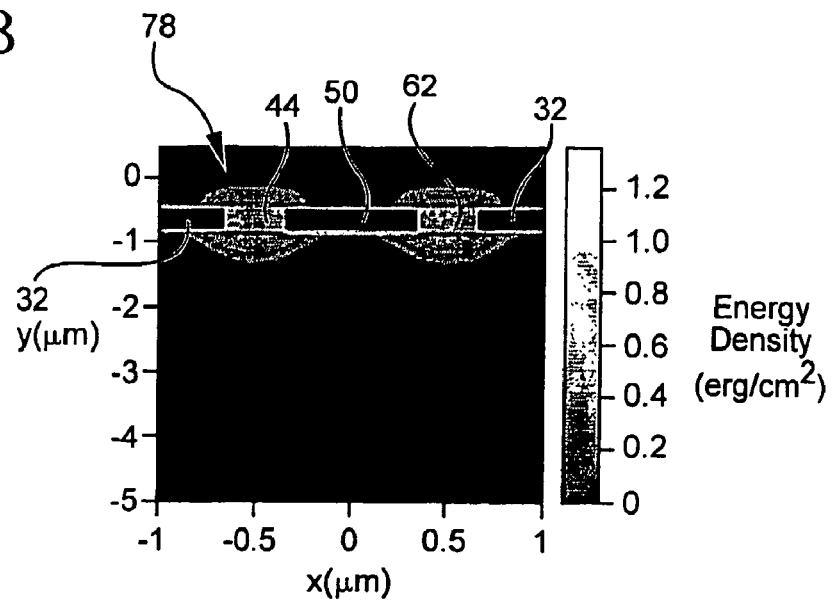
FIG. 4b is a plot of the effective electromagnetic energy density for the 1$^{st}$ order CM at 0.5 eV for an embodiment of the MSM structure formed in accordance with the present invention.

In FIG. 4a, a plot of the effective electromagnetic energy density for the $1^{st}$ order HSP mode 76 at 0.36 eV for an MSM device with a substrate of $Hg_{0.276}Cd_{0.324}Te$ is shown, without any modification to align the HSP and CM mode. FIG. 4b is a plot of the effective electromagnetic energy density for the $1^{st}$ order CM mode 78 at 0.5 eV for the same structure. The regions of brightest intensity (white areas) indicate highest energy density.

Figure 4C:
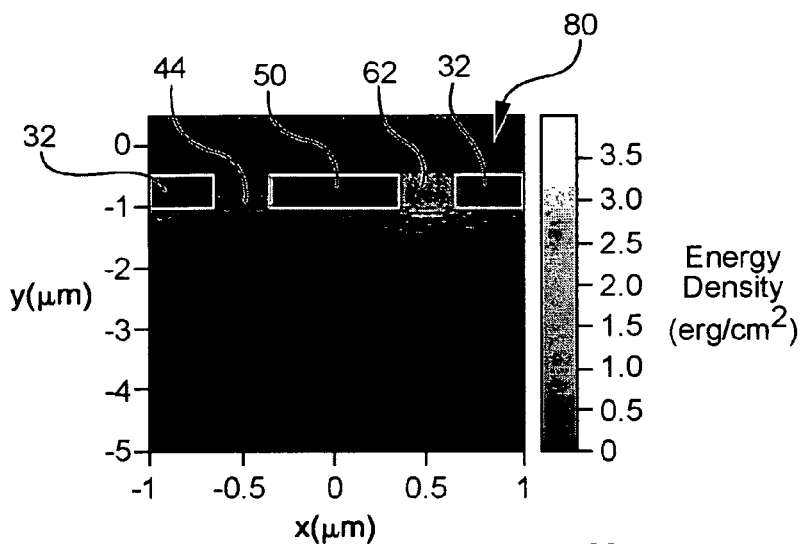
FIG. 4c is a plot of the effective electromagnetic energy density for a hybrid mode at 0.37 eV for an embodiment of the MSM device according to the present invention, which includes $Hg_{0.276}Cd_{0.324}Te$.

FIG. 4c is a plot of the effective electromagnetic energy density for a hybrid mode of SPs 80 at 0.37 eV for a $Hg_{0.276}Cd_{0.324}Te$ MSM structure formed according to the present invention. The electrodes of both the first 32 and second arrays 50 include $Hg_{0.276}Cd_{0.324}Te$. The contact widths (w), contact window widths (c), and thickness or height (h) for both the first and second arrays are w=0.7 µm, c=0.3 µm, and h=0.65 µm, respectively. The contacts of both first 32 and second arrays 50 include aluminum (Al). The groove dielectric constant for the first contact window 44 is 3.25 and for the second contact region 62 is 1.0.

In one embodiment of the optical device of the present invention, the substrate includes mercury cadmium telluride. Each of the first and second electrodes include a metal, preferably aluminum. In addition, the first dielectric constant is preferably in a range of about 1.75 to about 4.0, and is greater than the second dielectric constant In one embodiment, the first dielectric includes silicon oxide.

In another embodiment, the second dielectric is air.

An optical device including a substrate of mercury cadmium telluride of the present invention and a first dielectric constant in a range of about 1.75 to about 4.0, which is greater than the second dielectric constant, also preferably includes a structure that resonantly couples with a hybrid ER mode. The hybrid mode preferably includes at least an SP cavity mode and an HSP mode.

In one embodiment, the wavelength range of a mercury cadmium telluride device of the present invention includes about 2.0 micrometers to about 4.0 micrometers.

In another embodiment, the wavelength range of a mercury cadmium telluride device of the present invention includes about 4.0 micrometers to about 15.0 micrometers.

In another embodiment, the wavelength range of a mercury cadmium telluride device of the present invention includes about 15.0 micrometers to about 25.0 micrometers.

In another embodiment, the wavelength range of a mercury cadmium telluride device includes any range within 2.0 micrometers to 40.0 micrometers.

The optical device including a substrate of mercury cadmium telluride may include a first and second window width of from about 0.5 micrometers to about 0.9 micrometers. Each of the first and second contact thickness is preferably chosen from a range of about 0.45 to about 0.85 micrometers. In addition, each of the first contact width and the second contact width is preferably chosen from a range of about 0.2 to about 0.5 micrometers.

It is seen that in this direct bandgap material with a high absorption constant, either a CM mode coupled device 78, which is characterized by the energy density distribution shown in FIG. 4b, or a hybrid SP mode exhibiting the energy density distribution 80 shown in FIG. 4c may be a useful model for the fabricating a high performance MSM detector in this direct bandgap material. In these cases, the field intensity is maximum and concentrated in the contact window regions between the electrodes where the static applied field is greatest; therefore, higher speed of response can be obtained. For the HSP mode coupling 76 exhibited in FIG. 4a, by contrast, the energy density within and beneath the contact windows 44 and 62 is not much greater than the energy density of the incident beam in a region 82 above the contacts. Also, a significant portion is positioned directly centered beneath both contacts 32 and 50. Charge carriers localized in this area will drift to respective electrodes with undesirable increased transit time.

Figure 5:
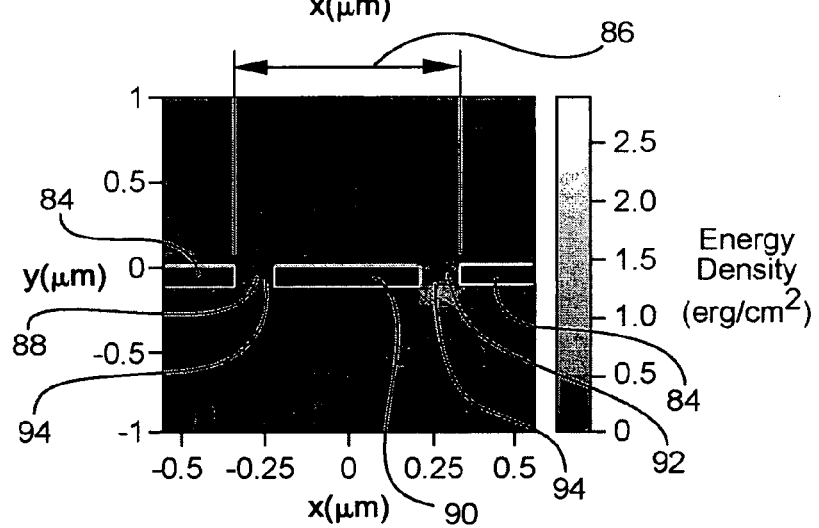
FIG. 5 is a plot of the effective electromagnetic energy density for a hybrid mode at 1.6 eV for a Si MSM device according to the present invention.

Referring to FIG. 5, a hybrid mode for a silicon MSM device formed in accordance with the present invention is shown. Si is an indirect bandgap material with a low absorption coefficient ($\alpha$) of about $3.82 \times 10^2$/cm at 850 nm. The Si MSM structure includes a first array of 0.125 µm thick gold (Au) contacts 84, 1.08 µm pitch 86, 0.43 µm wire width, 0.11 µm contact window 88 width, and a first groove dielectric constant for the first contact window region 88 of about 3.8.

The second array of contacts 90 (only one of which is shown), includes identical parameters, with the exception that the second contact window region 92 has a second groove dielectric constant equal to about 1.0. The structure was designed to align a hybrid mode composed of a CM and a WR and diffracted components in Si, at 1.6 eV and produce a desirable electromagnetic energy profile for a Si-based MSM device operating at least within a range of from about 830 nm to about 850 nm. The effective electromagnetic energy density for the hybrid mode 94 at 1.6 eV is plotted, where highest energy density regions are indicated by the brightest regions (white) in FIG. 5. The hybrid mode that is produced largely concentrates the electromagnetic fields 94 close to the contact/Si interface below the contact windows. As is seen, adjacent windows will substantially differ in the amount of photocurrent generated.

In an embodiment of a silicon MSM device of the present invention, the substrate includes silicon and the electrode structure is optimized to resonantly couple with a hybrid mode that includes at least a CM and HSP mode. The preferred operating wavelength range of the device includes from about 830 nanometers to at least 850 nanometers. In addition, each contact width is greater than the respective window width.

Preferably, the first dielectric constant is in a range from 1.75 to 4.0 and is greater than the second dielectric constant.

In one embodiment, each of the first and second window width is chosen from a range of 0.075 µm to 0.25 µm.

In another embodiment, each of the first and second contact thickness is chosen from a range of from about 0.075 to about 0.2 µm.

In another embodiment, each of the first contact width and the second contact width is chosen from a range of 0.2 µm to 0.4 µm.

Referring to FIG. 5, a slight misalignment of the HSP and WR modes producing a CM/diffracted mode hybrid was desirable to shape the electromagnetic energy profile to exhibit characteristics of CM modes slightly more strongly than a perfect alignment would produce over the preferred wavelength range. The electromagnetic energy density is amplified by a factor of approximately forty (40) compared to the electromagnetic energy density produced by the incident beam well above the structure. Therefore, even though the area of high energy density is small in the window regions, there will be a large concentration of electron-hole pairs produced in this area resulting in a large absorption and "effectively" reducing the absorption length of Si. This window region near the contact/Si interface is the most desirable location for charge carriers to be produced because the static electric field produced by the applied bias is largest in this region and able to quickly sweep the carriers to their respective contacts. Consequently, the device described by the energy density profile 94 of FIG. 5, is capable of high bandwidth operation.

Particularly for MSM devices of the present invention using Si substrates, as well as for those using other semiconductor materials characterized by low absorption coefficients (e.g., less than about $10^3$/cm within the preferred wavelength range of operation), the electric field is most preferably engineered to be amplified and concentrated in a small area in the contact window regions of the MSM device. The static electromagnetic field in this area has the highest strength for sweeping the electron/hole carriers to the respective electrode. By properly patterning the electromagnetic field density profile, therefore, the absorption length of Si is effectively shortened, which provides for a high bandwidth MSM photodetector.

Figure 6:
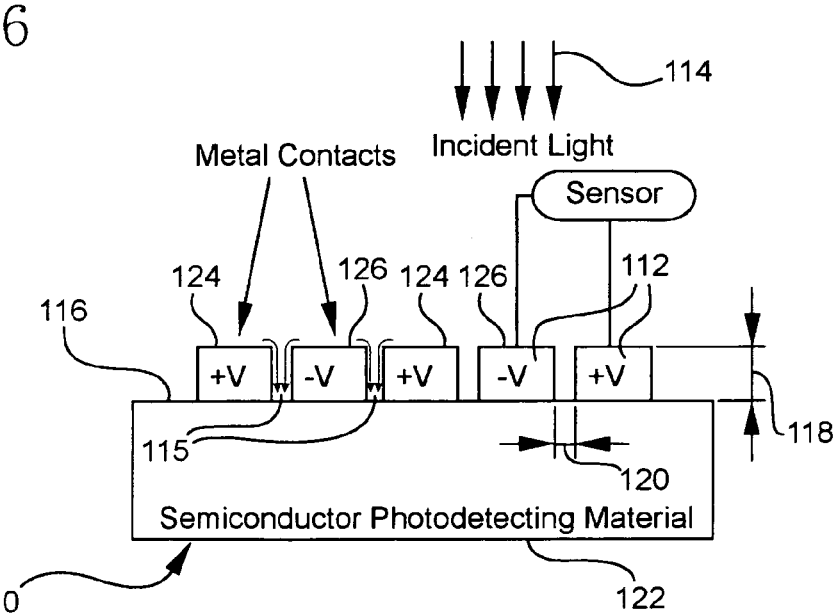
FIG. 6 is a cross-sectional side view of another embodiment of an MSM detector formed in accordance with the present invention, having a high aspect ratio.

Referring to FIG. 6, another embodiment of an MSM device of the present invention preferably includes a semiconductor characterized by a high absorption coefficient within a wavelength range of interest. A detector 110 of the present invention includes a multiplicity of electrodes 112 spaced in a substantially regular pattern. The electrodes 112 are adapted to resonantly couple between an external optical wave 114 to be detected and a local wave, e.g., a surface plasmon wave 115. The surface plasmon wave 115 includes a component of momentum oriented substantially perpendicular to a detector surface 116 of the detector 110, i.e., the wave 115 includes a CM. A sensor (not shown) is connected to the electrodes 12 for sensing an electrical quantity.

The detector surface 116 is preferably a substantially planar surface, which is partially directly exposed to the external optical wave 114. The detector surface 116 coincides with a surface of the substrate 122. Alternatively, one or more layers of transmissive optical material may be deposited on the substrate 122 to form the detector surface 116.

In this embodiment, the structure associated with the multiplicity of electrodes 112 preferentially supports the CM 115. This particular structure, and CM mode coupling generally promotes efficient, enhanced transmission of the incident wave 114 by channeling light around the electrodes 112.

The optical detector 110 further includes a substrate 122 in superposed relationship with the multiplicity of electrodes 112, which includes a semiconductor material.

The substrate 122 of this embodiment may comprise any semiconductor as described supra. For the particular embodiment shown in FIG. 6, however, the preferred substrate 122 includes at least one direct bandgap semiconductor. Preferably, the semiconductor has a high absorption coefficient within the desired wavelength range of detection. Most preferably, the absorption coefficient is greater than about $10^3$ cm$^{-1}$.

In one embodiment of the device 110 for use in high-bandwidth, high-sensitivity devices in the near infrared range, e.g., from about 1.0 micrometers (μm) to about 1.6 μm, the substrate 122 comprises InGaAs. These devices are particularly useful for high bandwidth communication systems In another embodiment of the device 110 for use in a high-bandwidth, high-sensitivity device for use in the near to mid-infrared range, e.g., from about 1.0 μm to about 26 μm, the substrate includes mercury cadmium telluride (HgCdTe). Applications include thermography, $CO_2$ laser detection and missile guidance. As is the case with all compound semiconductors, the wavelength of peak response depends on the material's band-gap energy, which can easily be varied (in this case over a fairly large range) by changing the alloy composition.

The detector 110 of the embodiment shown in FIG. 6 is characterized by an aspect ratio sufficient to support the substantially perpendicular surface plasmon or cavity modes 115. The aspect ratio is defined as a ratio of a height 118 of the electrodes 112 to a spacing 120 between adjacent electrodes 112.

In one embodiment, the aspect ratio is at least about 1 in order to support the substantially perpendicular components of momentum of the surface plasmon wave.

In another embodiment, the aspect ratio is at least about 3.

In another embodiment, the aspect ratio is preferably less than about 16.

In a preferred embodiment, the aspect ratio is substantially in a range of at least about 4 to less than about 10.

In another embodiment, the aspect ratio is preferably substantially in a range greater than about 10 to less than about 15.

In another embodiment, the aspect ratio is preferably substantially in a range of at least about 7 to less than about 12.

In one embodiment, the aspect ratio is not less than about 3 and not greater than about 16.

In yet another embodiment, the aspect ratio is substantially in a range greater than about 10 and less than about 15.

Surface plasmons are electromagnetic excitations at the surface of a metal, which, once excited, can transfer part of their energy into an adjoining surface, in this case, the semiconductor. The surface plasmons, therefore, advantageously increase the efficiency of a photodetector. Prior art devices have applied the concept of surface plasmons to flat or low profile electrode geometries, because it was seen that the surface plasmons in the plane of, and parallel to, the detector enhanced the amount of light coupled into the semiconductor.

Referring still to FIG. 6, the MSM detector of the present invention additionally exploits the surface plasmons oriented substantially perpendicular to the detector surface 116, the CMs, to enhance the efficiency of transmission of light. The enhanced transmission may be achieved by using a high aspect ratio electrode structure. The enhanced transmission allows for smaller spacing 120 between adjacent fingers of the electrodes 112 and larger height 118. The larger electrode height 118 produces less resistance in the fingers of the electrodes 112, producing a higher speed device without significantly reducing the light sensitivity of the device. The smaller spacing 120 decreases the transit time of the photogenerated carriers, thus also increasing the speed of the device without significantly reducing the light sensitivity of the device.

The spacing of an MSM detector formed in accordance with the present invention is preferably not less than about 20 nanometers (nm).

In still another embodiment of an MSM device formed in accordance with the present invention, a particular preferred geometry and aspect ratio of the contacts, e.g. interdigitated fingers, are determined by a preferred wavelength, polarization, and angle of incidence sensitivity desired. The optimal height 118 and aspect ratio is preferably determined, in part, by the preferred range of optical wavelength sensitivity of the optical detector 110 formed in accordance with the present invention. Generally, as the contact or finger height 118 increases, surface plasmon energy decreases, and the corresponding wavelength of the surface plasmon resonance increases. The height 118 is preferably chosen so that the surface plasmon resonance wavelength corresponds to a wavelength at peak responsivity of the semiconductor 122, the detector 110 being optimized for detection of light in the range of peak spectral responsivity of the semiconductor material.

In one embodiment, a minimum height of the electrical contacts or fingers of the electrodes of a detector of the present invention is about 50 nm.

In yet another embodiment, a height of the electrical contacts or fingers of the electrodes of a detector of the present invention is substantially within a range of about 75 nm to about 750 nm.

In another embodiment, a maximum height of the electrical contacts or fingers of the electrodes of a detector of the present invention is about 1500 nm.

In another embodiment, the height of the electrical contacts is comparable to the preferred wavelength range of detection.

In an additional embodiment, the height of the electrical contact is greater than 2 micrometers.

The dependence of polarization and angle of incidence on the amount of incident light, centered at a particular wavelength, which is transmitted through a linear stepped profile or grating structure is well-known to those skilled in the art. The substantially regular pattern of the electrodes of the present invention represents a grating-like structure. The geometry (in particular, the spacing 120 and electrode pitch) of the electrode structure, therefore, is preferably additionally optimized to enhance a preferred angle of incidence of the incident light at a particular wavelength to be detected. As is well-known to those skilled in the art, the amount of a linearly polarized light which will be transmitted is determined largely by the orientation of the incident polarized wave relative to the orientation of the electrode structure.

The device of the present invention, therefore, preferably optimizes the electrode spacing, pitch, and orientation to exploit the resonant coupling effect, well-known to those skilled in the art, provided by the substantially regular electrode structure (i.e., an electrode grating). These parameters are optimized in accordance with the preferred wavelength, polarization, and angle of incidence sensitivity of the detector formed in accordance with the present invention. The height of the electrode contacts is further optimized to reduce resistivity for increased speed and simultaneously, to enhance transmission of light within the preferred wavelength sensitivity range by resonant coupling with the substantially perpendicular surface plasmon modes.

In yet another embodiment, an MSM device of the present invention further includes a second multiplicity of electrodes spaced in a substantially regular pattern and positioned in superposed relationship with the substrate and the multiplicity of electrodes. The second multiplicity of electrodes is rotated at an angle relative to the orientation of fingers of the first electrodes and in the plane of the detector surface. Preferably, the second multiplicity of electrodes is rotated at an angle of about 90° to the fingers of the first electrodes.

The second multiplicity of electrodes is also adapted to support a surface plasmon wave having a component of momentum oriented substantially perpendicular to the detector surface. The MSM device of this embodiment will preferably resonantly couple at least orthogonal linear polarization components of unpolarized light incident on the device, therefore, advantageously enhancing detection of unpolarized light.

By exploiting the substantially perpendicular components of the momentum, in contrast to the prior art, both high light sensitivity and a fast response time are achieved at the preferred wavelength, polarization, and angle of incidence. The high aspect ratio structure is specifically adapted to support the CM surface plasmons.

Figure 7:
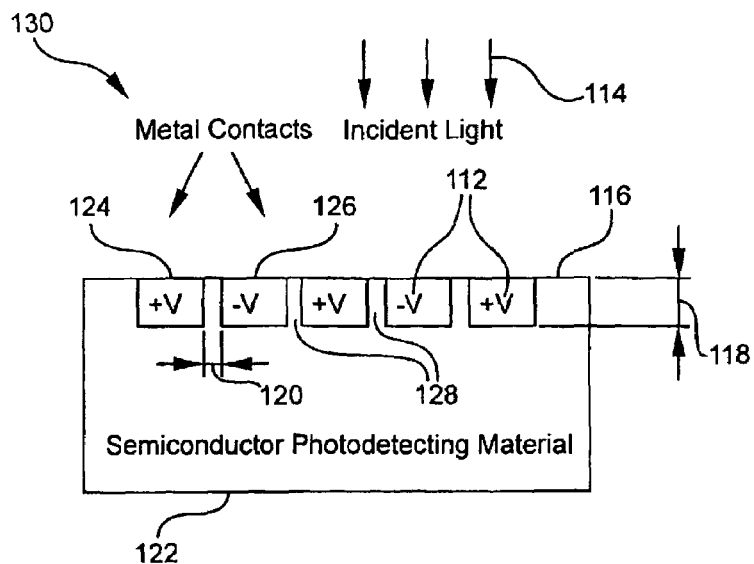
FIG. 7 is a cross-sectional side view of yet another embodiment of an MSM detector formed in accordance with the present invention.

Referring to FIG. 7, a preferred embodiment 130 of an MSM detector formed in accordance with the present invention includes a second semiconductor material 128 positioned in the deep spacing 120 between adjacent fingers of the electrodes 112. The second semiconductor 128 preferably comprises the same semiconductor material as the substrate 122. In this embodiment, the absorbing semiconductor material 128 is preferably in the location of the amplified electromagnetic fields caused by the surface plasmons, and therefore, the device 130 shown in FIG. 7 will have a higher sensitivity than existing devices.

The speed of response of a photodetector is typically partially limited by an intrinsic response time, defined as the duration in time necessary for the device to return to equilibrium after being exposed to light. In other words, when a light pulse penetrates the semiconductor material of a typical MSM detector, it generates hole pairs which are swept away from the semiconductor and toward the electrodes. The holes travel toward a negatively charged electrode, while the electrons travel toward a positively charged electrode. The photogenerated electrons and holes either reach the respective electrode and leave the semiconductor material or recombine with each other. The period of time it takes for the electron and hole concentrations to return to their equilibrium conditions is the intrinsic response time. The intrinsic response time is typically limited either by the transit time of electrons and holes between the electrodes or carrier recombination time.

The speed of response of prior art MSM devices, therefore, has been increased by reducing the spacing between adjacent electrodes. The speed of response, however, is also partially limited by the resistance and capacitance of the electrodes, the speed being inversely proportional to the product of the resistance and capacitance of the electrodes. It has been recognized in the prior art, that the capacitance and the transit time can both be advantageously reduced by reducing both the spacing between adjacent electrodes and reducing the width of the electrodes. In so doing, however, the resistance of the device is increased, hence reducing the speed of the device.

With reference to the embodiment of the device shown in FIG. 6 110 and FIG. 7 130, the intrinsic response time is reduced and speed of response of the device is preferably increased by reducing the spacing between adjacent electrodes or electrode fingers to increase the speed (by reducing transit time), while increasing the height 118 and the aspect ratio to reduce the resistance of the device 110.

Referring also to FIG. 3, the speed of response of the MSM device 110 of the present invention, for example, is proportional to the inverse of the product of the resistance and capacitance of the so-called fingers 48 of the interdigitated electrodes 46. The capacitance per finger length $C_o$ is defined by equation (1) as follows:

$$C_o = \frac{\varepsilon_o(1+\varepsilon_r)K(k)}{K(k')} \tag{1}$$

where $C_o$ is the capacitance per finger length, $\epsilon_o$ is the permittivity of free space, $\epsilon_r$ is the dielectric constant of the semiconductor and $K(k)$ and $K(k')$ are elliptical integrals defined by the following equations:

$$K(k) = \int_0^{\pi/2} \frac{d\phi}{\sqrt{1-k^2\sin^2\phi}} \tag{2}$$

$$k' = \sqrt{1-k^2} \quad \text{and} \quad k = \tan^2\frac{\pi w}{4p}. \tag{3}$$

In these equations, w is the electrode width and p is the electrode pitch.

In addition, the total capacitance, C, of the device 10 is inversely proportional to the pitch, p, in accordance with the following equation:

$$C = C_o \times A_{device}/p \tag{4},$$

where $A_{device} = l_{device} \times w_{device}$ is the total area of the device, $l_{device}$ and $w_{device}$ being the length and width of the device respectively.

Figure 8:
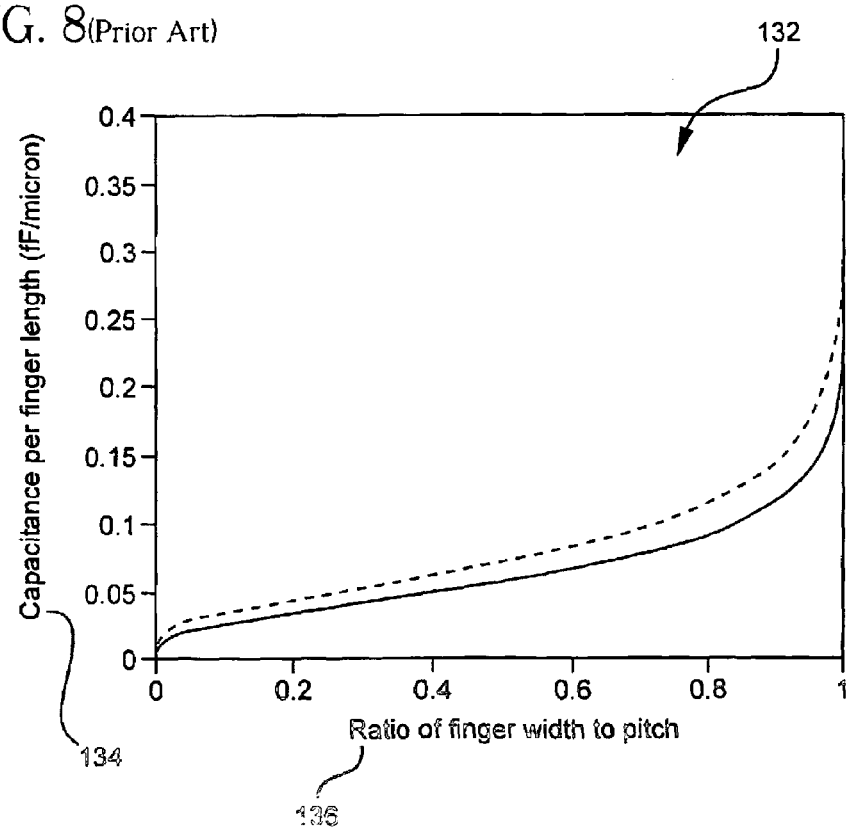
FIG. 8 is a plot of capacitance of a typical prior art MSM device.

Applying equations (1) through (4), a plot 132 of the capacitance per finger length, $C_o$, as a function of the ratio of finger width to pitch 136 is plotted in FIG. 8. From FIG. 8, it is seen that as the spacing 120 between the electrode fingers 48 decreases for a fixed electrode pitch p (or equivalently, when the electrode width w increases relative to the pitch), the overall capacitance C increases, thus limiting the speed of the device. Reducing the resistance by increasing the thickness 118 of the fingers of the electrodes offsets this increase in capacitance, allowing a reduction in the spacing 120 to increase speed, by reducing transit time of the electrons.

The structure of a device formed in accordance with one embodiment of the present invention, therefore, includes an aspect ratio of at least 1, and preferentially supports surface plasmon resonance modes substantially perpendicular to a detector surface. This structure enhances light channeling into a semiconductive substrate. The high aspect ratio geometry reduces resistance and offsets the bandwidth-increasing effect of an increase in capacitance caused by reducing the electrode spacing to increase the speed of response of the device. Further, a height of the electrodes is preferably optimized for a preferred wavelength sensitivity range, and an optimum aspect ratio and preferred geometry of the device are found by considering effects of height and spacing on speed, as well as on the preferred wavelength, angle of incidence, and polarization sensitivity desired.

Numerical models have been developed to model the effect of surface plasmon in prior art devices and to model and optimize ER modes including SPs in MSM devices formed in accordance with the present invention.

Figure 9:
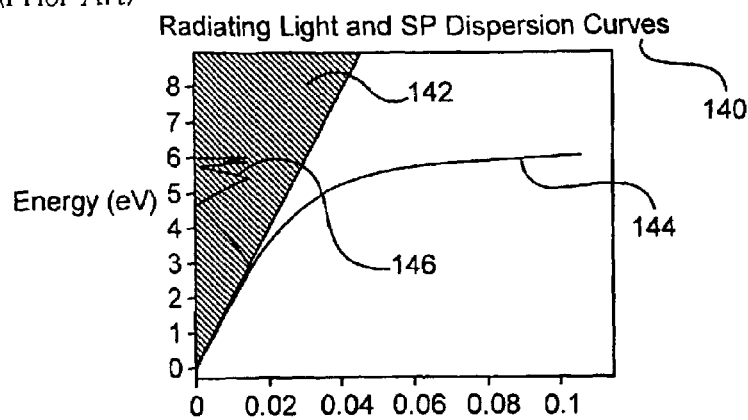
FIG. 9 is a dispersion curve of prior art MSM devices.

For example, FIG. 9 shows a dispersion curve 140 of prior art devices. Energy is plotted as a function of the wavevector for all possible radiating light modes (shaded area 142) for surface plasmons on a flat surface 144 and for surface plasmon modes on a slightly periodically modulated metal surface 146. The line 144 describing the surface plasmon modes on a flat surface never lies in the shaded area 142, indicating that these modes can not interact with light. The altered modes are in the shaded area 142 and can interact with light. These are the modes with momentum component parallel to the device surface, representative of prior art devices.

Figure 10:
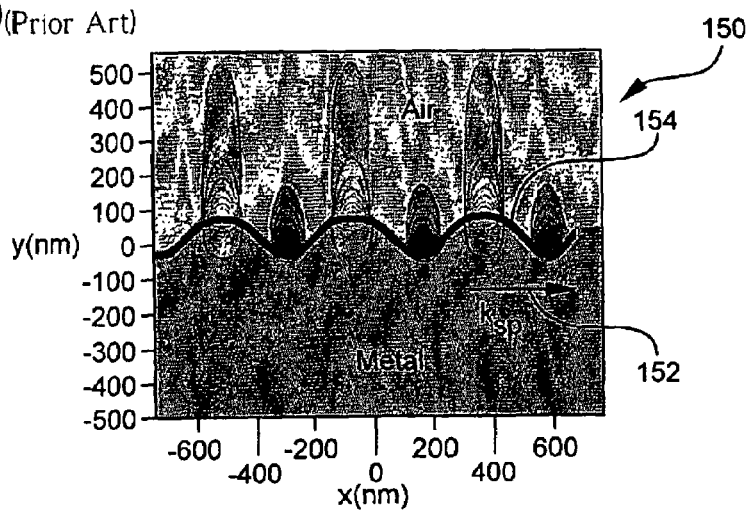
FIG. 10 is a plot of an electromagnetic field profile of a prior art MSM device.

FIG. 10 represents the electromagnetic field profile of a typical (horizontal) surface plasmon mode 150 with momentum $K_{sp}$ 152 parallel to a surface 154 having a small periodically modulated air/metal interface. The field is amplified at the interface 154 causing some enhanced detector sensitivity.

Figure 11:
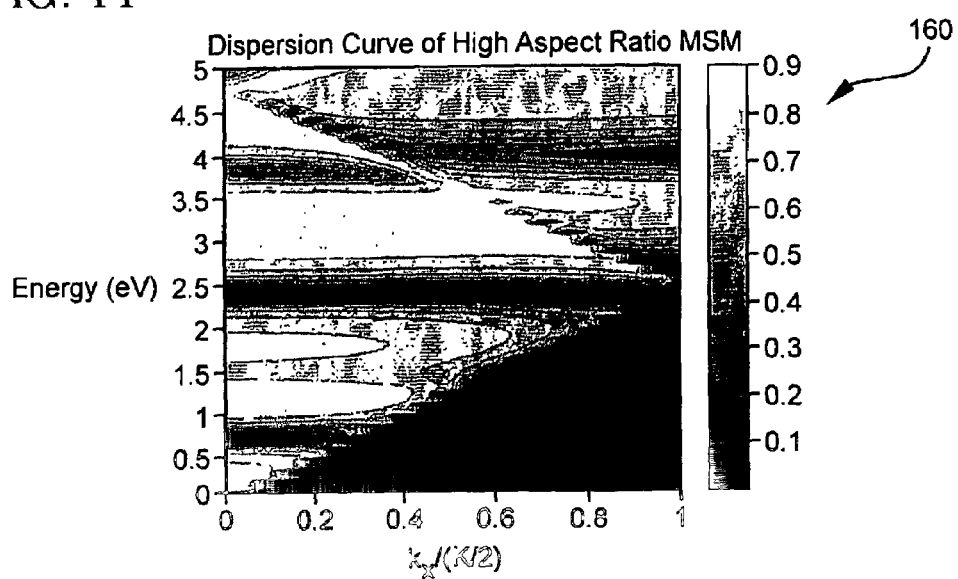
FIG. 11 is a dispersion curve of an MSM detector formed in accordance with the present invention.

Referring to FIG. 11, the dispersion curve 160 of high aspect ratio MSM detectors of the present invention differs markedly from that of the prior art MSM detectors optimized for HSP coupling as can be seen by comparison with FIG. 9. The high aspect ratio MSM device described by FIG. 11 comprises 250 nm thick aluminum contacts spaced 250 nm apart and with 30 nm spacing in between the contacts, corresponding to an aspect ratio greater than 8.

FIG. 11 is a graph of the reflectivity of light incident on the structure as a function of energy on the y-axis and normalized in-plane momentum (i.e., momentum parallel to the surface of the device) on the x-axis. A minimum in the reflectivity curves indicates the existence of a surface plasmon mode. In FIG. 11, these minima are seen as shaded dark lines or areas.

The surface plasmon modes shown in FIG. 11 near and along the $k_x/(K/2)=0$ (i.e. the y-axis) correspond to surface plasmon modes with close to zero in-plane momentum and nonzero momentum substantially perpendicular to the surface of the device. The light that excites or produces these modes is substantially normally incident light (i.e., light that has a zero angle of incidence), a common angle of incidence encountered in applications of an MSM device.

In this example, the detector is optimized for an energy centered at about 2.5 eV, corresponding to enhanced transmission of incident light with an optical wavelength of about 500 nm.

Figure 12:
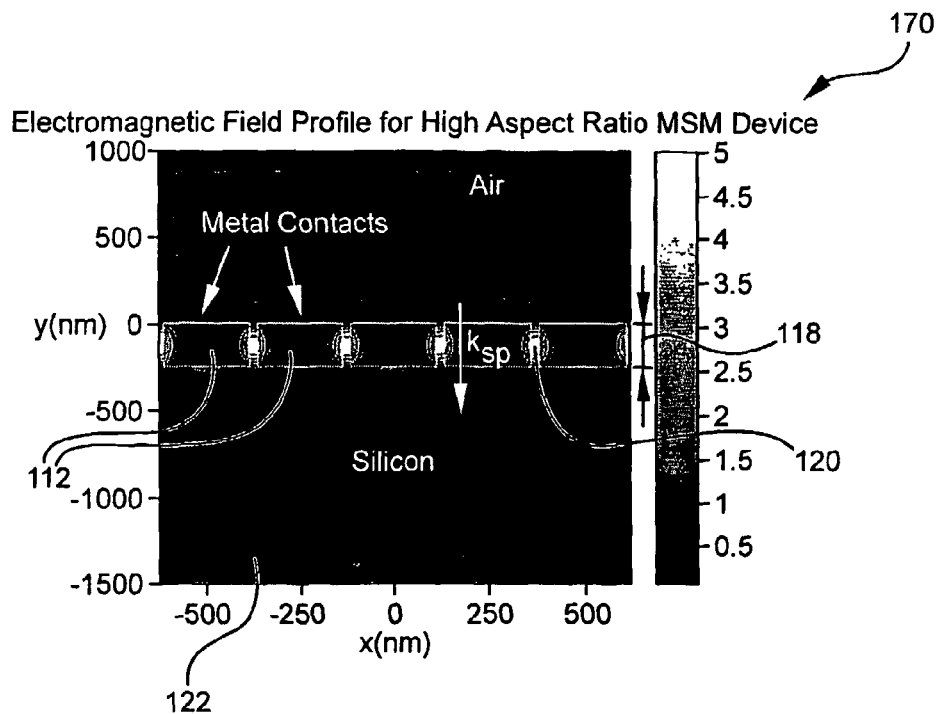
FIG. 12 is a plot of the electromagnetic field profile of an MSM detector formed in accordance with the present invention.

FIG. 12 is a plot of the electromagnetic field profile 70 for the high aspect ratio MSM detector described by FIG. 11.

Numerical models developed in the present invention may be applied to any one or combination of ERs including WR anomalies, diffracted modes, CM and HSP modes. The same model is also adaptable to an analysis of Fabry-Perot resonances that are obtained with the silicon-on-insulator (SOI) structure described infra (see FIG. 22).

As discussed supra, an increasingly accepted view of the mechanism responsible for the enhanced transmission of certain grating structures is the coupling of Wood-Rayleigh anomalies on the top-layer (air)/contact and contact/bottom-layer (semiconductor) interfaces via a CM, also referred to as a vertical surface resonant (VSR) mode, in the grooves of the grating. Several numerical modeling techniques have been used to try to calculate the optical characteristics of grating structures, including rigorous coupled plane wave (RCPW) techniques, integral techniques, finite difference time domain techniques, and modal methods.

The present invention extends the surface impedance boundary condition (SIBC) for analysis of the ER modes of the complex structures represented by FIG. 2.

The SIBC method, described for example, in Lochbihler, et al., "Highly Conducting Wire Gratings in the Resonance Region," *Applied Optics*, 32(10): p. 3459-3465 (1993) uses the approximation incorporated into the following relation between the tangential components of the electric and magnetic fields at a dielectric/metal interface:

$$E_{\parallel} = Z\hat{n} \times H_{\parallel} \tag{5}$$

where $Z=1/n_{metal}$, with $n_{metal}$ being the complex index of refraction for the metal and $\hat{n}$ being the unit normal vector at the dielectric/metal interface directed into the dielectric. The units used herein are cgs unless otherwise noted. For the p-polarization and with the use of Maxwell's equations, one obtains:

$$\frac{\partial H}{\partial \hat{n}} = -ik_o \varepsilon_{dielectric} ZH = \eta H \tag{6}$$

where $\epsilon_{dielectric}$ is the dielectric constant of the dielectric material at the dielectric/metal interface, $k_o=w/c=2\pi/\lambda$ and $n=ik_o\epsilon_{dielectric}$.

In the following example, the structure shown in FIG. 2 is analyzed, using an extended SIBC method assuming all of the contacts have the same thickness. There are four regions for which the electromagnetic fields are calculated: region 1 being the air region 69, region 2 being the left groove 44, region 3 being the right groove 62, region 4 being the substrate 40. The fields in the metal wires are not calculated in the SIBC method, however, they are not assumed to be zero as in the perfect conductor approximation. Several new aspects of the SIBC method were developed and are discussed briefly herein. Let the function $f_i(x, y)$ be the p-polarized magnetic field in the $i^{th}$ region. The fields in regions 1-4 can be expressed as:

$$f_1(x, y) = \exp(i(\alpha_o x - \beta_o y)) + \sum_{n=-\infty}^{\infty} R_n \exp(i(\alpha_n x + \beta_n y)) \quad (7)$$

$$f_2(x, y) = \sum_{n=0}^{\infty} \Phi_{2,n}(x, y) \quad (8)$$

$$f_3(x, y) = \sum_{n=0}^{\infty} \Phi_{3,n}(x, y) \quad (9)$$

$$f_4(x, y) = \sum_{n=-\infty}^{\infty} T_n \exp(i(\alpha_n x - \tilde{\beta}_n y)) \quad (10)$$

where $\alpha_n = k_o \sin \theta_i + nK$, $K = 2\pi/d$, $\beta_n = \sqrt{k_o^2 - \alpha_n^2}$, $\tilde{\beta}_n = \sqrt{\epsilon_4 k_o^2 - \alpha_n^2}$ with d being the period 60 of the structure (the distance from one finger to the distance of the next identical and identically surrounded finger), $\theta_i$ the angle of incidence, $\lambda$ the wavelength, and $\epsilon_i$ the dielectric constant of the $i^{th}$ region. Also, the modes $\Phi_{i,n}$ with i=2, 3 constitute an orthonormal set of modes in the groove regions and are:

$$\Phi_{i,n}(x,y) = X_{i,n}(x) Y_{i,n}(y) \quad (11)$$

$$X_{i,n}(x) = d_{i,n} \sin(\mu_{i,n}(x-\delta_i)) + \cos(\mu_{i,n}(x-\delta_i)) \quad (12)$$

$$Y_{i,n}(y) = a_{i,n} \exp(i v_{i,n}(y+h)) + b_{i,n} \exp(-i v_{i,n}(y+h)) \quad (13)$$

where $\delta_2 = -x_5$ and $\delta_3 = x_1$ and the terms $\mu_{i,n}$ and $v_{i,n}$ obey the relation:

$$\mu_{i,n}^2 + v_{i,n}^2 = \epsilon_i k_o^2 \quad (14)$$

After expressing the fields in the above way, the SIBC conditions are first used to calculate the terms $d_{i,n}$ and $\mu_{i,n}$. Applying the SIBC condition to the left-hand side of the grooves results in the relations:

$$d_{i,n} = \frac{\eta_i^L}{\mu_{i,n}} \quad (15)$$

The subscript on $\eta$ denotes the region (either 1-4 in the simplified structure). Also, because the wires can be composed of different metals, the superscript on $\eta$ is needed to denote which metal is at the metal/dielectric interface at that particular location. For the air and substrate region, there will be left, middle and right $\eta$ terms denoted as, $\eta_i^L$, $\eta_i^M$, $\eta_i^R$. For the two groove regions, there will only be left and right $\eta$ terms.

Applying the SIBC condition on the right-hand side of the two grooves results in the relations:

$$\tan(c_i \mu_{i,n}) = \frac{(\eta_i^L + \eta_i^R)\mu_{i,n}}{\mu_{i,n}^2 - \eta_i^L \eta_i^R} \quad (16)$$

Equation 16 has to be solved numerically for the values of $\mu_{i,n}$. It is important that the values of $\mu_{i,n}$ be precisely determined to insure accurate results. For p-polarization, a Newton-Ralphson method is usually adequate. For s-polarization, Eq. 16 must be solved using a more capable technique. If the left and right-hand bounding metals are the same, Eq. 16 reduces to the standard transcendental equation given in other references on the SIBC method, such as Lochbihler, et al.

The undetermined coefficients, $R_n$, $T_n$, $a_{i,n}$ and $b_{i,n}$ are then determined by the use of the fact that the tangential components of the electric and magnetic fields are continuous across any interface. Equating the tangential field components at the interfaces between regions 1 and 2, 1 and 3, 2 and 4, and 3 and 4 yield equations for the intervals: $-x_5 \leq x \leq -x_4$ and y=0; $x_1 \leq x \leq x_2$ and y=0; $-x_5 \leq x \leq -x_4$ and y=-h; and $x_1 \leq x \leq x_2$ and y=-h. Imposing the SIBC condition produces three more equations for y=0 and for y=-h, which turn out to be relatively simple to work with and cast into matrix equations. First, the fact that the modes $X_{2,m}(x)$ as well as $X_{3,m}(x)$ constitute sets of orthogonal modes in regions 2 and 3 can be used, for example, for the case where the metal bounding the left and right-hand sides of the groove are identical. However, these modes are also orthogonal if the metals are different and have the following normalization factors:

$$N_{2,mn} = \int_{-x_5}^{-x_4} X_{2,m}(x) X_{2,n}(x) dx \quad (17)$$

The factors $N_{3,mn}$ are the same after substitution of 3 for 2 in the terms' subscripts. Six matrix equations are ultimately derived from the equations above, which represent the field profile throughout the device. The equations are then solved given the amplitude of the input beam I to obtain the reflectance, transmittance, absorption, and the electromagnetic field profiles.

Figure 13:
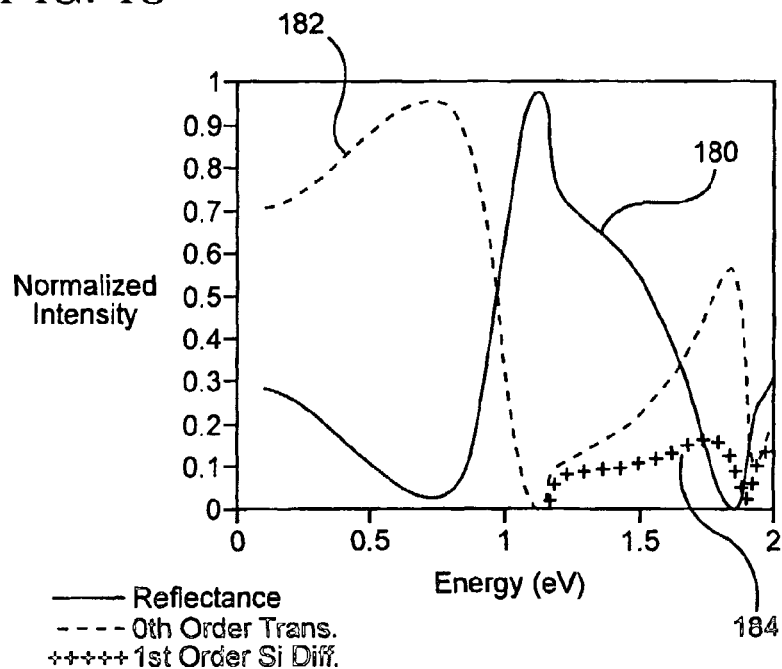
FIG. 13 is a plot of reflectance, 0$^{th}$ order transmission and 1$^{st}$ order diffraction efficiencies for an MSM photodetector of the present invention.
Figure 14A:
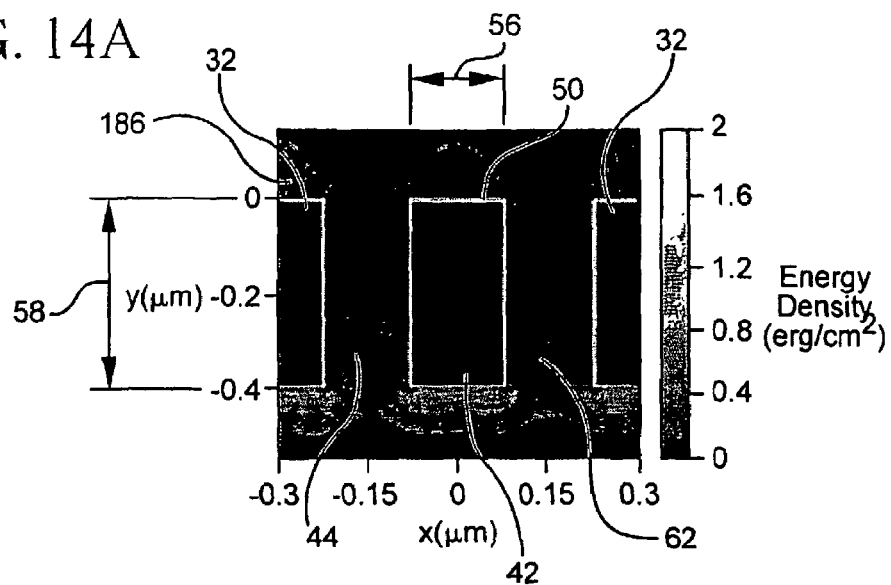
FIG. 14(a) is a plot of an example of an effective electromagnetic energy density profile for the (1.11 eV) HSP in an MSM detector.
Figure 14B:
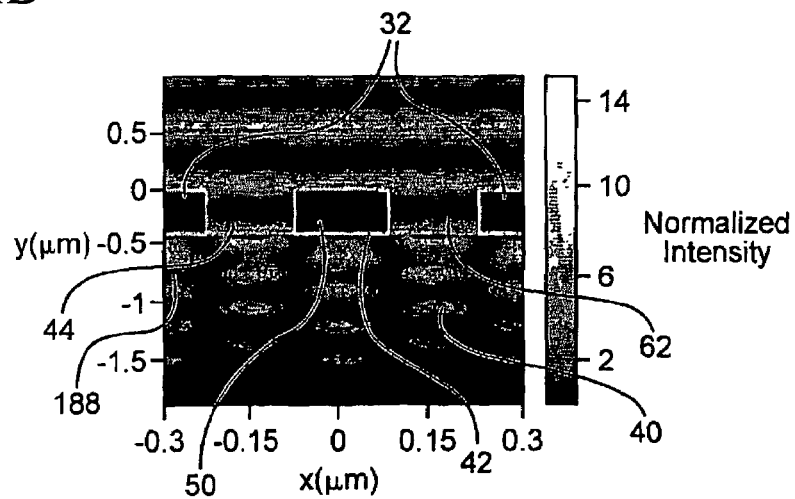
FIG. 14(b) is a plot of an example of an effective electromagnetic energy density profile for a (1.16 eV) Wood-Rayleigh anomaly.
Figure 14C:
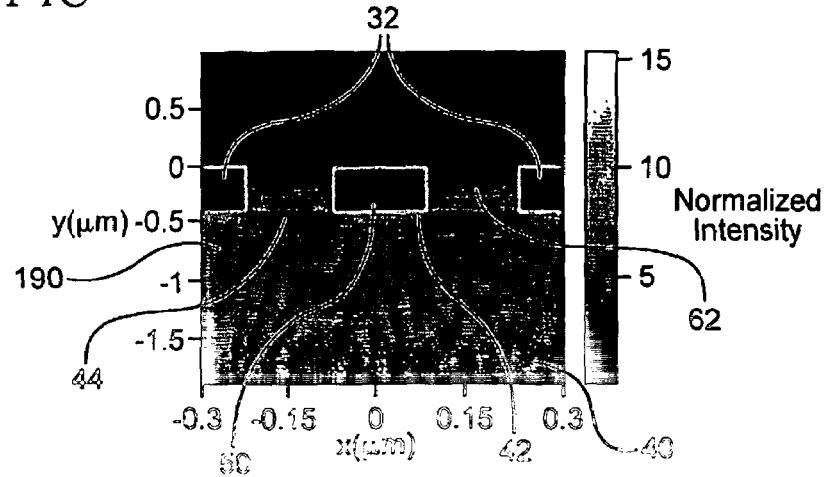
FIG. 14(c) is a plot of an example of an effective electromagnetic energy density profile for a 0.73 CM having a high intensity 0$^{th}$ order transmitted component.

As discussed supra, there are three basic types of ER modes for the grating-like electrode structure of the MSM device of the present invention: horizontal surface plasmon modes (HSP), Wood-Rayleigh anomalies (WR), and vertical cavity modes (CM). Examples of these three modes and their effects are shown in FIGS. 13-14. The reflectance 180, transmission 182, and ±1 order diffraction efficiencies 184 in silicon (Si) for normal incidence are shown in FIG. 13 for an Si MSM structure with identical 150 nm wide 56 400 nm thick 58 gold (Au) contacts with a pitch 60 of the first contact array of 600 nm and air in the grooves. Because the contacts are identical, the "true" pitch is 300 nm. Referring to FIG. 13, there is a broad CM made at 0.73 eV, an HSP mode at 1.12 eV and an associated WR at 1.16 eV. The HSP causes a clear minimum in the transmittance while the CM causes a maximum in the transmittance. The magnetic field intensities of these three ER modes are shown in FIGS. 14(a), 14(b) and 14(c). FIG. 14(a) is a plot of the effective electromagnetic energy density for a 1.11 eV HSP. The HSP mode is characterized by a strong dependence on wavelength and angle of incidence. Generally, the HSP mode has a slightly lower energy than an associated WR resonance. Structurally, the HSP mode has a moderate to strong dependence on contact pitch, and a small dependence on the contact thickness 58 and on contact window width, and a moderate dependence on the conductivity of the first 32 and second 50 metal contacts.

The electromagnetic field corresponding to the HSP 186 is concentrated and amplified close to the contact/semiconductor interface and regions of the high field intensity exist directly underneath the contact and much less under the contact windows.

Referring to FIG. 14b, a 1.16 eV Wood-Rayleigh anomaly resonance is plotted, and shown to have a similar dependence as HSPs on the wavelength and angle of incidence of the incident beam, and on the structure parameters. In addition, the WR electromagnetic field 188 is concentrated and amplified close to the contact/semiconductor interface 42, but less so than the HSPs. The WR anomalies are the onset of a diffracted mode so they become less confined at the contact/semiconductor interface as the energy of the incident beam is increased. Also, regions of the high field intensity exist directly underneath both the contacts and contact windows.

Referring to the plot of a 0.73 eV CM 190 in FIG. 14c, the vertical cavity modes can have a smaller wavelength dependence than HSPs and WRs. These modes have a weak dependence on the angle of incidence of the incident beam. Structurally, the CMs exhibit a small dependence on contact pitch, and a moderate to strong dependence on contact thickness 58, contact window width, and on the dielectric constant of the first 44 and second grooves 62. The CMs couple with $0^{th}$ order incident and transmitted beams to produce enhanced transmission, and have a high field intensity in the groove region 44. With the fields associated with the $0^{th}$ order incident and transmitted beams, the CM can produce field profiles similar to FIG. 14(c).

These three types of ER modes have different effects on the reflectance, transmittance and the concentration or localization of light near the contact/semiconductor. In lamellar gratings of the type shown in FIG. 2, WRs and HSPs usually occur in pairs with the HSP having a slightly smaller energy than the associated WR mode. Both WRs and even more so HSPs concentrate light near a dielectric/metal interface but they have drastically different effects on the reflectance and transmittance. The $0^{th}$ order incident beam, WRs and diffracted modes can couple on either side of the metal contact layer via a cavity mode producing enhanced transmission. Thus WRs often lead to reflectance minima and transmission maxima. On the other hand, HSPs do the opposite, producing reflectance maxima and transmission minima.

WRs and HSPs have primarily the same structural dependencies with HSPs being more sensitive to the metal and dielectric material in the grooves. The structural dependencies of both HSPs and WRs are much different than structural dependencies of CMs. Calculations corroborate the obvious physical reasoning behind the structural dependencies of these modes which are listed above. This fact is important because the energies at which HSPs/WRs pairs and CMs occur fairly independently and therefore allowing for the alignment of CM and HSP/WR modes producing a "hybrid" mode. These hybrid modes may be useful in optoelectronic applications and depending on the application, the use of either HSPs, WRs, CMs, or hybrid modes may be most beneficial. For MSM detectors, neither HSPs, WRs or CMs themselves are not ideal for high speed operation, reasons for which are evident in FIGS. 14(a), (b) and (c). Both the HSPs and WRs produce large electromagnetic field distributions directly under the contacts where the static electric field produced by the applied bias is very small. Also, HSPs generally have a large absorption of the incident beam in the glossy metal wires. The CM modes produce $0^{th}$ order radiating transmitted components that produce large electromagnetic field distributions deep within the semiconductor where the static electric field produced by the applied bias is also small. For both of these modes, photogenerated carriers in these undesirable locations produce carriers that slowly drift to their respective contacts, limiting the speed of the device.

There are many types of asymmetries that can be introduced into the structure to tailor the optical characteristics depending on the application. As soon as any asymmetry is introduced into the structure, as illustrated in FIG. 2, the true pitch will no longer be the distance from the middle of one wire to the middle of the next wire (or a leading edge to leading edge) but will instead be twice that distance.

The use of different metals for the alternating metal fingers enhances the Schottky contacts for electrons and holes separately. If the two different metals have high conductivities such as Au, silver (Ag), or aluminum (Al), then the transmittance is relatively the same except for a degradation in maxima and minima of the reflectance and transmittance as one uses less conductive metals for the other set of fingers. For very high aspect ratio transmission or reflection gratings, the choice of metal has more of an effect.

Figure 15:
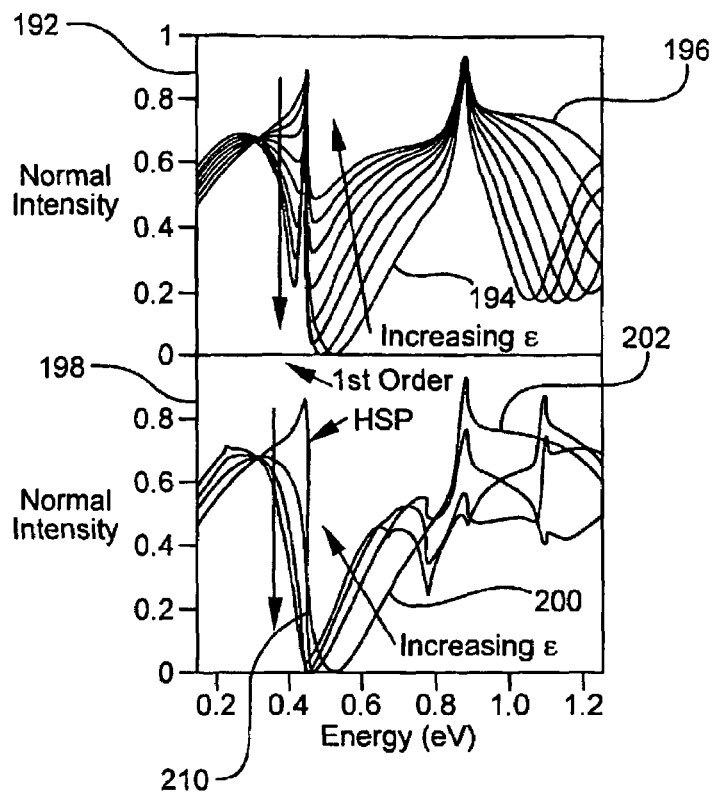
FIG. 15 is a plot of reflectance curves of an MSM device illustrating the effect of placing a dielectric in the grooves.
Figure 16:
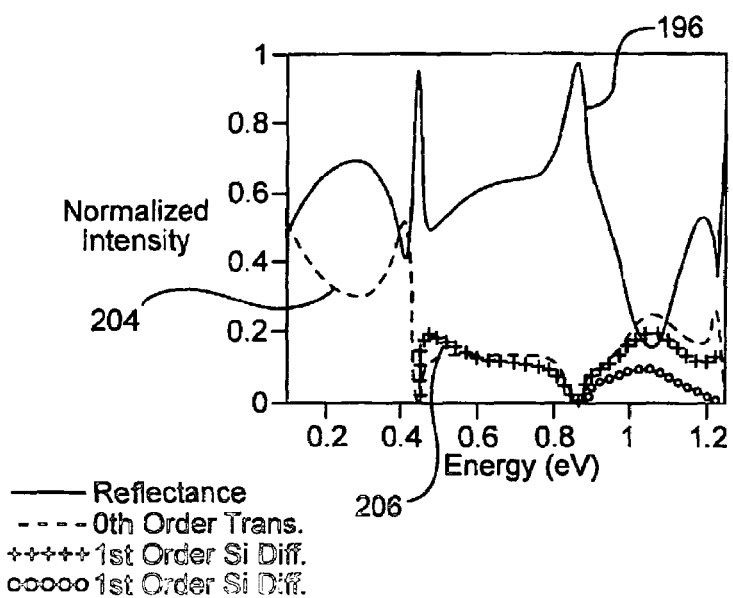
FIG. 16 is a plot of reflectance, transmission, and 1$^{st}$ and 2$^{nd}$ order diffraction efficiencies in a silicon substrate, illustrating an HSP strongly excited by a coupling with the CM mode.
Figure 17:
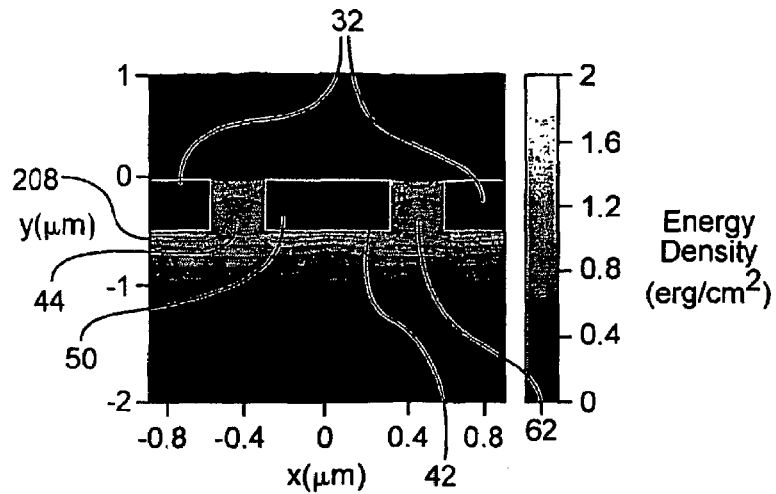
FIG. 17 is an effective electromagnetic field density profile of a 0.45 eV hybrid HSP/CM mode.

Placing a dielectric material in grooves will do several things to the ER modes. If one puts a dielectric material in each groove in a symmetric way, the pitch of the grating remains unchanged and therefore the energies of the HSPs and WRs are largely unchanged, however the CM will decrease in energy as the dielectric constant of the material in the grooves is increased. This phenomenon is observed in FIG. 15 where the reflectance 192 is shown for normal incidence light on a structure with Au contacts on Si bulk substrate, pitch=1.6 μm, contact width w=0.56 μm, window width c=0.24 μm, contact height (thickness) h=0.5 μm, with the grooves filled with dielectrics with increasing dielectric constants. The reflectance 192 is plotted in FIG. 15 for all groove dielectrics having a dielectric constant of $\epsilon=1$ 194 to $\epsilon=2.2$ 196 in increments of 0.2. The reflectance 198 as $\epsilon$ in every other groove increases from $\epsilon=1$ 200 to $\epsilon=4$ 202 in increments of 0.5 is plotted in the bottom half of FIG. 15. For this structure, with grooves having a dielectric constant $\epsilon=2.2$ 196, FIG. 16 shows that the HSP inhibits energy from being distributed into the $0^{th}$ transmitted mode 204. The alignment of the CM mode and HSP/WR pair results in a sharp maxima in the reflectance 196 as the reflectance-enhancing-contact/Si-HSP is efficiently excited by the coupling with the CM mode (see FIGS. 16-17). FIG. 17 shows a 0.45 eV hybrid HSP/CM mode 208 with typical electromagnetic field profiles associated with both vertical surface plasmon resonances and horizontal surface plasmons, showing clearly that both are excited. Almost no incident energy is coupled into the $0^{th}$ order transmitted beam.

Figure 18:
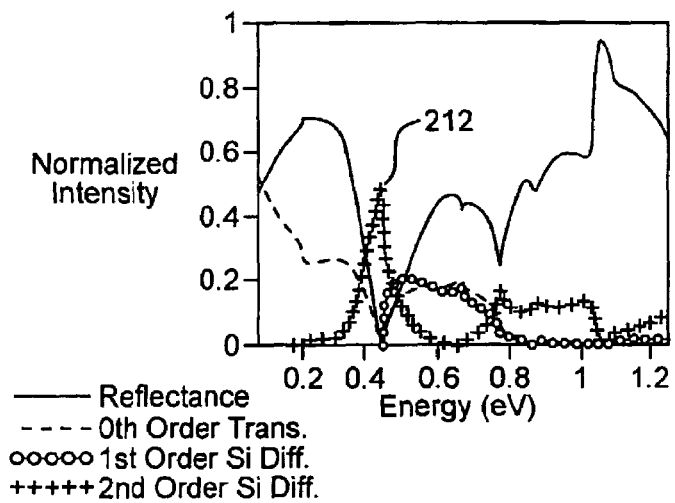
FIG. 18 is a plot of the reflectance, 0$^{th}$ order transmission and diffraction efficiencies in Si for an MSM device of the present invention.
Figure 19A:
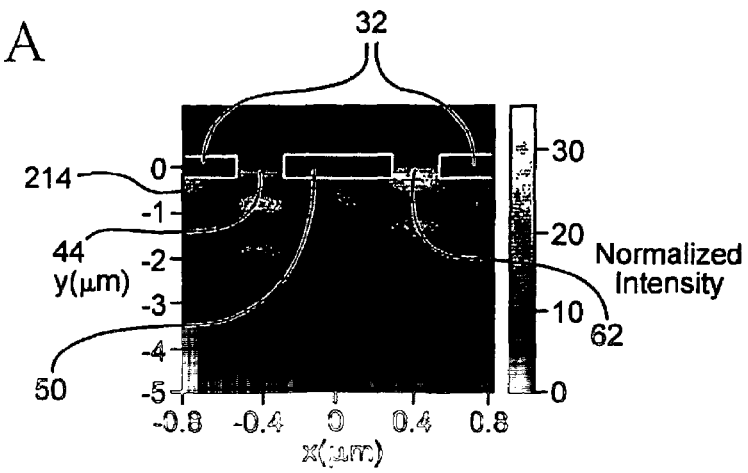
FIG. 19a is an effective electromagnetic field density profile for the 0.45 eV hybrid CM/WR mode in Si for an MSM device of the present invention.
Figure 19B:
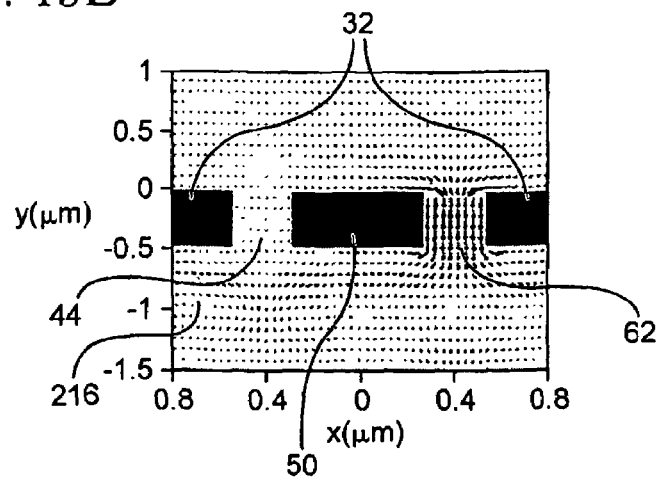

If one puts a dielectric material in every other groove (alternating grooves) and therefore increases the true pitch of the structure (periodicity of the structure) to twice what it initially was, then something much different than the previous case occurs. Because the HSPs are more closely confined to the neighborhood of the structure and have more electromagnetic field intensity within the materials of the structure, the HSPs are more sensitive to changes to the structure as compared to WRs. It is seen in the bottom half of FIG. 15 that as soon as the dielectric constant of the alternating grooves is increased and becomes different than the dielectric constant of the other set of alternating grooves, the HSP at 0.45 eV 210 is weakened substantially. Referring to FIG. 18, once the HSP is out of the way, the incident beam and WR/$1^{st}$ order diffracted modes in Si can couple more strongly via the CM. Because the new "true" pitch is twice what it was when the first and second groove dielectrics were Me same, there are new ±1 diffracted components 212 starting at 0.22 eV that have a sharp maximum at 0.45 eV. As is seen in FIG. 18 at 0.45 eV, the incident beam is 50% coupled into the +1 Si diffracted order and 50% into the −1 diffracted order resulting in a beam that travels parallel to the contact/Si interface. The magnetic field intensity profile 214 is shown in FIG. 19a and a plot of the Poynting vector 216 is shown in FIG. 19b for the 0.45 eV hybrid CM/WR mode. Both plots show that energy from the incident beam is channeled around the contacts through the right hand groove 62 (with a dielectric material with $\epsilon=3.8$) and into the WR/±1 Si diffracted orders.

In applying the above analysis and method of the present invention to design high bandwidth, high responsivity MSM photodetectors, the dependency of the characteristics of HSPs, CMs, and hybrid modes on the materials used should be considered. Besides the obvious energy dependence of HSP, CM and hybrid modes, there are other design considerations. For instance, direct bandgap materials generally have large absorption coefficients (absorption length is small); therefore, methods to restrict the incident electromagnetic field profile closer to the contact/semiconductor interface may not be necessary. Also, in materials or at energies where the imaginary part of $\epsilon$ is large, the HSP modes are weaker and poorly defined. Because of these two things, HSPs or hybrid modes may be less attractive to use than CMs in direct bandgap materials. In Si-based MSMs however, the situation is different because Si is an indirect bandgap material and has a small to moderate absorption constant in the important wavelength range around 850 nm. Therefore, the MSM device of the present invention is preferably optimized for HSPs, WRs or hybrid modes for high speed operation. Most preferably, a Si MSM photodetector is optimized for coupling WR/CM hybrid modes.

Referring to the geometry of FIG. 2, in one embodiment of an MSM detector which couples the hybrid ER mode of this type (WR/VSR and diffracted components in Si) the electrode structure is optimized to obtain a high responsivity, high bandwidth bulk-Si MSM-PD by channeling the incident light around the contacts and localizing it near the contact/Si interface between the contacts. In this embodiment, the substrate 40 of MSM detector includes silicon. The second dielectric constant of the second groove 62 is preferably greater than the first dielectric constant of the first groove 44. Most preferably, the second dielectric constant is in a range of about 1.75 to about 4.

In one embodiment, the second dielectric preferably includes silicon oxide.

Preferably, at least one of the first thickness 58 and the second thickness 66 is at least 100 nm.

In another embodiment, each of the first 58 and second contact thickness 66 is about 125 nm.

In this preferred silicon MSM detector, the structure associated with the first 32 and second array 50 of electrodes preferably resonantly couples between the incident optical wave and the local hybrid ER mode having WR/CM and diffracted components in Si.

The first 56 and second contact widths 64 of this device may be equal.

In another embodiment, the first contact width 56 is greater than the first window 44 width and the second contact width 64 is greater than the second window 62 width. Preferably both contact widths are each at least two times the respective window width. The first and second window widths may be equal.

Preferably, the silicon MSM device has a responsivity of at least 0.25 A/W and a bandwidth of at least 15 GHz.

The operating wavelength range of the Si MSM detector may include 800 nm to 900 nm. Most preferably, the operating wavelength range is from about 830 nm to about 850 nm.

Figure 20:
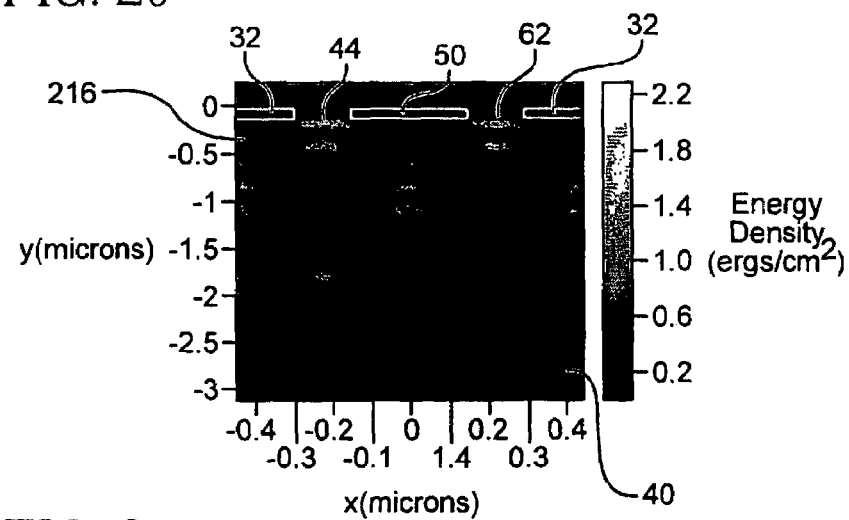
FIG. 20 is a plot of an effective electromagnetic field density profile for a hybrid mode at 1.46 eV in Si for an MSM device of the present invention.
Figure 21:
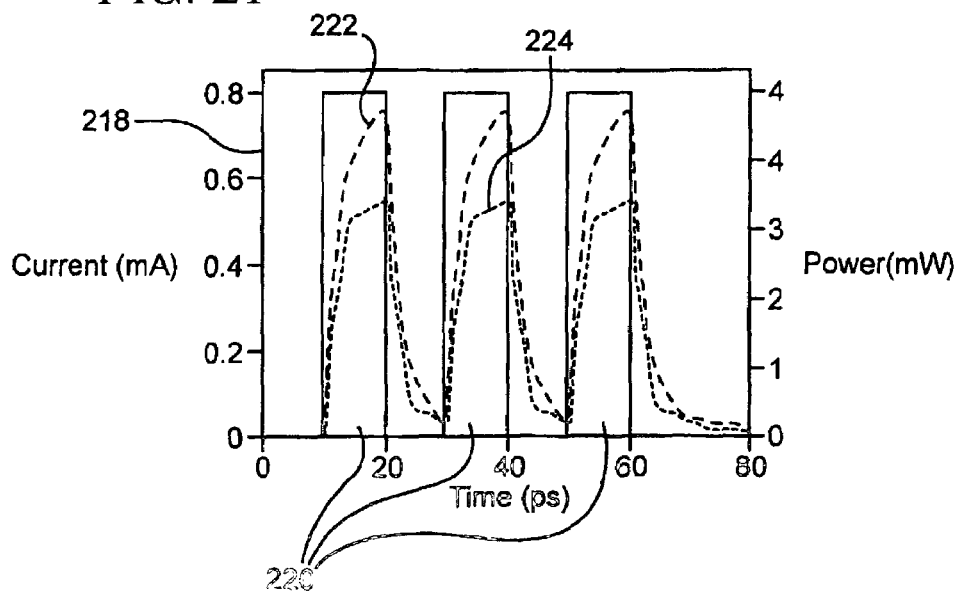
FIG. 21 is a plot of electron and hole current in the device of FIG. 20.

FIGS. 20-21 are plots of the energy density profile 216 and induced photocurrent 218 respectively of a silicon MSM photodetector of the present invention with 300 nm wide, 125 nm thick Au first contacts 32 and second contacts 50 with 150 nm groove widths and in alternating (first) grooves 44, a -dielectric material with dielectric constant $\epsilon$ of 2 is inserted. FIG. 20 shows the effective electromagnetic density for the hybrid mode at 1.46 eV for this Si MSM structure. As seen, this hybrid mode largely concentrates the electromagnetic fields (higher density areas are lightest white areas in plot) close to the contact/Si interface below the windows 44 and 62. Instead of a slow exponentially decaying energy density profile pro-duced by the incident beam, as is typically assumed in the modeling of these devices, the energy is largely concentrated near the Si surface. FIG. 21 shows the induced electron and hole currents in the wires give a series of 10 ps in duration, 50% duty cycle, 850 nm incident pulses of light. A 5 mW TM polarized input pulse train (shaded in gray) 220, the electron current 222, and hole current 224 are plotted. These results suggest that this device can have a bandwidth of at least 30 while having a responsivity of at least 0.25 A/W.

Asymmetries of the width and thickness result in increasing the number of HSP and WR modes, inter alia. The energies of the CM modes will not change significantly but the increased number of HSP/WR modes may lie in the energy range of the broad CM modes and affect them. In addition, the "effective" pitch of the grating can be different from the perspective of electromagnetic fields in the air or from the perspective of the electromagnetic fields in the semiconductor substrate, because the pitch of the grating will increase from the perspective of both the air/contact HSP/WRs and the contact(semiconductor HSP/WRs by a factor of two. The pitch of the grating may increase from the perspective of only the air/contact HSP/WRs by a factor of two while the pitch from the perspective of contact/semiconductor HSPs remains the same.

In summary, using the extend SIBC method provided herein, the energy of HSP, WR and CM modes can be modified independently by changing different structural and material parameters. In addition, the effects of HSPs can be minimized and the WR and CM modes aligned by increasing the dielectric constant of every other groove. Also, adding one of the asymmetries described herein into the structure doubles the "actual" pitch of the structure, but may or may not double the "effective" pitch depending on which asymmetry is introduced. The present invention provides a high speed Si MSM photodetector with a bandwidth exceeding 50 GHz and responsivity exceeding 0.3 A/W by optimizing coupling of HSPs, WRs, CMs and hybrid modes.

The MSM device of the present invention has been discussed and analyzed supra assuming that the substrate includes a semiconductor in bulk form. However, the semiconductive substrate is not limited thereto.

Figure 22:
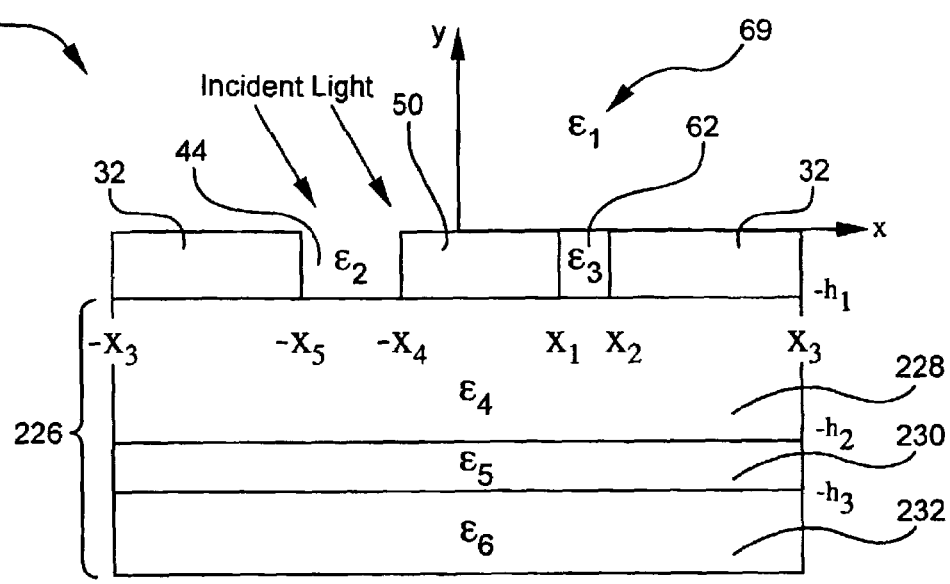
FIG. 22 is a cross-section through a portion of a preferred MSM detector formed in accordance with the present invention.

Referring to FIG. 22, in an additional embodiment of the MSM device 225, the substrate includes a silicon-on-insulator (SOI) structure 226. The SOI is a three-layer dielectric structure 226, which includes an insulator layer 230 positioned between a top layer of silicon 228 and a bottom layer of silicon 232.

Silicon-based metal-semiconductor-metal photodetectors (MSM-PD) and related Si-based photodetecting structures are of great interest because of the ability to integrate optical and electrical components on the same chip. The performance of Si MSM-PDs however, is poor compared to MSM photodetectors fabricated on several other materials, such as InGaAs. This is largely due to the fact that Si is an indirect bandgap material and the absorption length is long. This causes electron-hole pairs to be generated deep in the Si that require a long time to drift to the contacts and where they induce only a small photocurrent in the contacts. There have been many techniques used to enhance the bandwidth and responsivity of Si MSMs but efforts to improve one tend to degrade the other. It was reported that by the introduction of a buried layer in the silicon region, the carriers generated deep in the bulk silicon substrate could be isolated from the detectors active region and the contact/Silicon/oxide layers of a silicon-on-insulator (SOI) can be used to produce a resonant cavity that concentrates the light in the top Si; both things would improve the performance of the device. Another method uses metal islands on top of the SOI layer to couple more light into the active silicon region. But a thorough analysis of the optical and electronic properties of the device in an accurate, time-dependent and interdependent way (i.e., the incident beam, static field and charge carrier motion and their effects on each other analyzed simultaneously) has not been done. The assumptions in these past works concerning the electromagnetic fields, the charge carrier generation rates and the induced current leads to an underestimation of the performance enhancing potential of these ER modes in Si-based MSM devices.

Referring to FIG. 22, the following example of an MSM having an SOI substrate 226 according to the present invention is described in terms of the various electromagnetic resonances including horizontal surface plasmons (HSP), surface plasmon cavity modes (CM) also referred to as vertical surface resonances (VSR), Wood-Rayleigh anomalies (WR), Fabric-Perot resonances (FPR) also referred to herein as cavity resonances (CR), and diffracted modes (DM) in the MSM fabricated on SOI. A combination of these modes enhances the bandwidth and responsivity of SOI MSM photodetectors according to the present invention. In doing this calculation, three algorithms are used in a time-dependent and interdependent way: (1) an extended surface impedance boundary condition (extended-SIBC) to calculate the electromagnetic field profile caused by the incident beam, (2) a Poisson's equation solver to solve for the pseudo-static field produced by the applied bias and charge carriers, (3) a Monte-Carlo algorithm to calculate charge carrier motion, photocurrent, recombination, bandwidth and responsivity. A combination of ER modes, i.e., a hybrid ER mode, is preferably optimized to accomplish two things to enhance device performance: channel the light around the metal contacts by the coupling of WR and diffracted modes on the air/contact interface and contact/semiconductor interface via a CM; and localize or concentrate the light in the Si at the contact/Si interface and in between the contacts. Channeling the light by coupling WR and diffracted modes enhances responsivity. Localizing the light in Si, as described, enhances bandwidth.

With a SOI, these two aspects are carried one step further by using the FPR associated with the contact/Si/insulator resonant cavity of the SOI. The resonant cavity in the Si layer 228 is bounded on one side by the contacts 32, e.g., and on the other side by the insulator 230. By integrating the FPR with the hybrid ER mode, a new hybrid mode is formed, and a significantly larger localization of the incident beam is possible.

Many aspects of the device 225 can be varied to tap into various ER modes and produce an optimal electromagnetic field intensity profile for MSM detectors in the semiconductor. Fields in the air region I 69, in the first semiconductor layer 228 forming region IV, in the second semiconductor layer 232, region VI, and in the insulator region V 230 are preferably expressed in pseudo-Fourier expansion according to Floquet's theorem. Fields in the groove regions II 44 and III 62 are preferably expressed as a linear combination of orthonormal modes and calculated using the extended-SIBC technique as summarized supra, and as described in Lochbihler et al., "Highly Conducting Wire Gratings in the Resonance Region," *Appl. Opt.* 32: 3459-3465 (1993). All the results shown here are for TM polarized (SPs only occur for TM polarization) and normal incidence.

Figure 23:
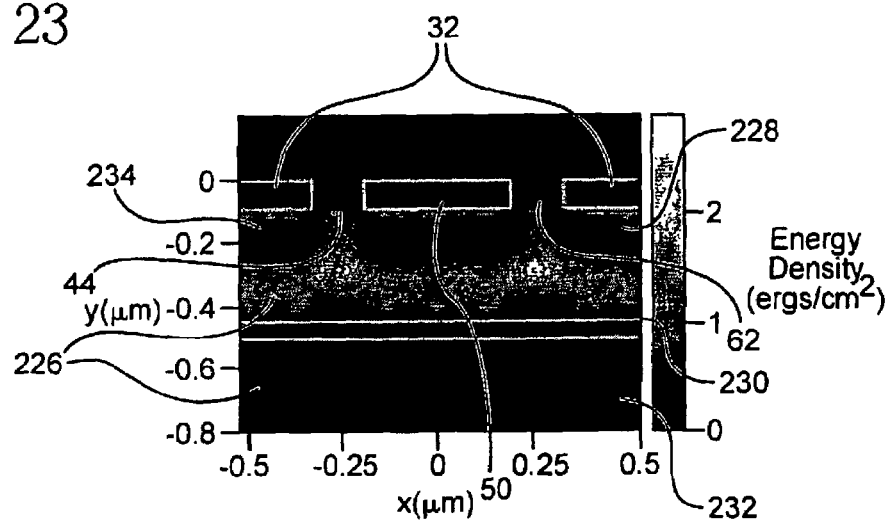
FIG. 23 is the effective electromagnetic field density profile for the preferred MSM detector of FIG. 22.

Referring to FIG. 23, there are a variety of different ER modes and diffracted modes that occur in structures with SOI substrates, including the FPR mode produced by the contact/Si/Insulator layers. This resonance effect is a simple Fabry-Perot effect without any connection to SPs of any sort. The thickness of the top thin Si film 228 is preferably adjusted so that the energy of this FPR mode matches the energy of the hybrid WR/VSR mode used in the bulk-Si MSM-PD. By doing so, the localization of light near the contact/Si interface is significantly enhanced, as seen in the profile of the electromagnetic energy density 234.

Figure 24:
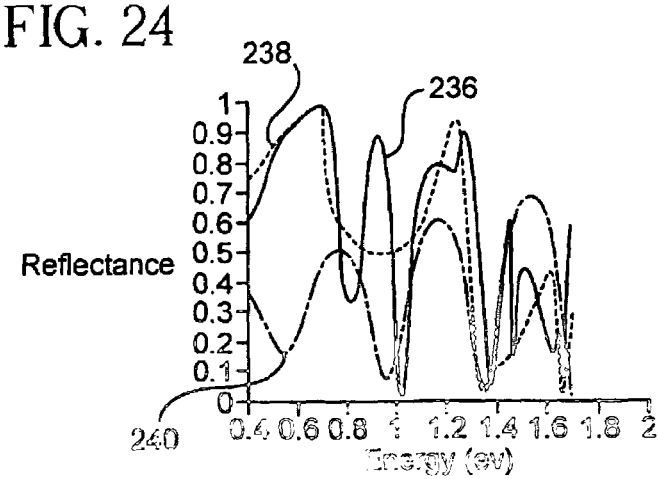
FIG. 24 is a plot comparing the reflectance curve for the preferred MSM detector of FIG. 20 with the reflectance curves obtained with no electrode structure.

FIG. 24 shows a series of reflectance curves. The top graph of FIG. 24 shows the reflectance 236 for the bulk-Si MSM-PD discussed supra, but with a top 350 nm Si layer 228 followed by a 50 nm thick silicon oxide insulator 230, in place of the bulk Si. The device 225 includes a pitch $d=2x_3=900$ nm, identical Au contacts of width w=300 nm and thickness $h_1=125$ nm, one set of alternating grooves with width c=150 nm and dielectric constant $\epsilon_2=2$, and the other set of alternating grooves with width c=150 nm and dielectric constant $\epsilon_3=1$.

In one embodiment of a Si MSM photodetector of the present invention, the substrate includes a silicon-on-insulator (SOI) structure. The SOI includes a top Si layer 228 and an insulator layer 230. Preferably, the top layer 228 is in a range from about 300 nm to about 400 nm. The insulator layer is preferably between about 25 nm and about 75 nm.

The ER resonance modes for the bulk-Si MSM-PD as described supra make use of a hybrid ER mode composed of a WR, diffracted components in Si, and a VSR to produce a desirable electromagnetic field intensity profile that is channeled around the contacts and localized near the contact/Si interface between the contacts.

Referring to FIG. 24, the reflectance curve 236 for the device including the SOI structure 226 has additional features resulting from the resonant effects of the SOI substrate. There are periodic maxima and minima associated with resonant constructive and destructive interface effects of the SOI. These effects are most evident when the reflectance for the bulk-Si MSM is low (i.e., when a larger amount of light is getting into the structure and can experience the SOI resonant effects).

FIG. 24 shows two additional reflectance curves for comparison, each for SOI substrates of the same dimensions as the SOI MSM-PD, namely the top Si layer 228 (350 nm) and oxide layer 230 (50 nm). One reflectance curve 238 includes a structure having a 30 nm thick continuous (i.e., unpatterned) Au film and another reflectance curve 240 is shown for the case of no metal film for comparison. These two comparison curves are given to illustrate the large variation in the locations (in terms of energy) of the maxima/minima of the reflectance depending on whether air or metal bounds one side of the Si thin film. Accurate calculation of the optical properties of SOI MSM-PD that includes the entire device (patterned contacts and the SOI) is preferably done using the extended-SIBC method of the present invention.

Referring to FIG. 23, the energy density profile at 1.46 eV 234 is shown. The localization of light is greatest under the contact windows 44 and 62, where the static field is the largest. The field in the bottom bulk-Si 232, on the other hand, is practically zero. This is desirable because it will avoid the creation of electron-hole pairs deep inside the substrate, improving the bandwidth and responsivity. The channeling effect of the ER modes, particularly a CM mode, shows the incident light being steered around the metal contacts into the active Si region 228. A CR (FPR) is then used to aid in localizing the light in the top Si layer 228.

Because light is localized in the top Si thin film 228 and between the contacts 32 and 50, the bandwidth and responsivity of the device 225 are high in comparison to conventional MSM detectors. In particular, the speed is not limited in the MSM device of the present invention by the charge-carrier behavior in Si, but by the capacitance and resistance of the metallic fingers and load.

Time-dependent, interdependent algorithms necessary for the analysis of the induced photocurrent in the contacts as a function of applied bias and the intensity and duration of the optical pulses can be calculated. Once the electromagnetic field intensity profile produced by the incident beam is calculated as discussed supra, the divergence of the Poynting vector is calculated. The electron-hole generation rate, which is proportional to the divergence of the Poynting vector, can also be calculated. The Poisson's equation solver and Monte Carlo algorithm are then preferably used to calculate the pseudo-static field, induced photocurrent (using Ramo's theorem), bandwidth and responsivity.

Figure 25:
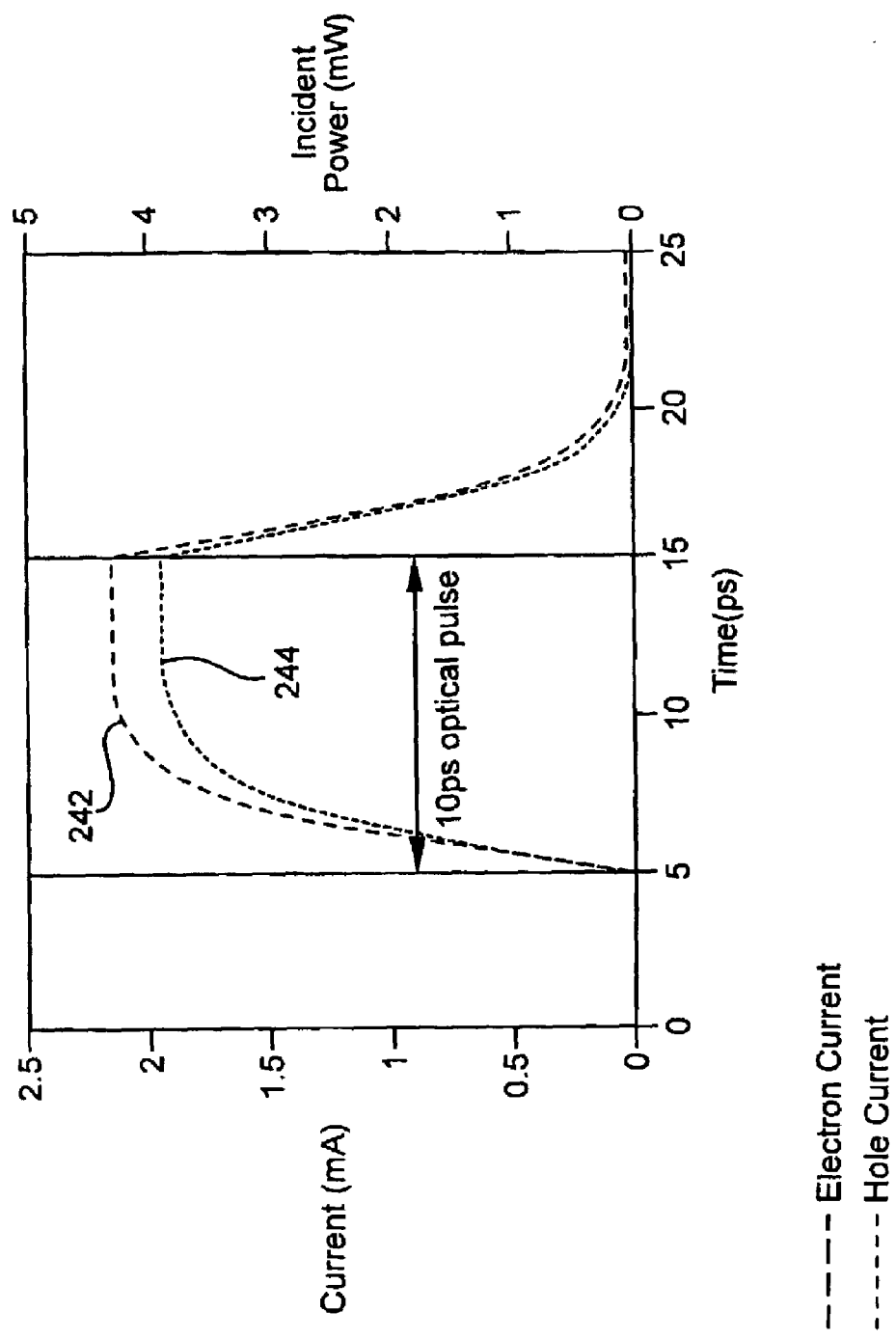
FIG. 25 is a plot of the electron and hole current for the device of FIG. 22.

In FIG. 25, the time domain response of a 50 μm×50 μm MSM photodetector 225, as described by FIGS. 22-23, is shown, assuming excitation by a series of 5 mW, 10 ps, 50% duty cycle pulses of 850 nm, TM polarized light. Both the induced electron current 242 and induced hole current 244 are shown. The responsivity for this device and at this speed is at least 0.3 A/W and may be 0.4 A/W or more. The rise and fall times of the two current components are very short (5 ps) indicating that these devices may be able to achieve bandwidths in excess of 50 GHz, or possibly 80 GHz, while maintaining a high responsivity of at least about 0.3 A/W.

In one embodiment of a Si MSM detector of the present invention, the responsivity is at least 0.25 A/W and the bandwidth is at least 30 GHz within an operating wavelength range of 830 nm to 850 nm.

The performance of the MSM devices of the present invention can, therefore, be derived using time-dependent, interdependent algorithms that accurately calculate most important operating device parameters of, e.g., SOI MSM-PDs. The MSM device of the present invention is optimized using a combination of ER modes to enhance device performance. In one embodiment, the MSM device includes an electrode structure that produces larger wavelength angle of incidence ranges for more desirable device operating characteristics. The method of optimizing may include analysis of heat effects, spatial hole burning and device saturation, as well as other aspects of the supporting integrated circuit (IC), e.g., load.

Although illustrative embodiments of the present invention have been described herein with reference to the accompanying drawings, it is to be understood that the invention is not limited to those precise embodiments, and that various other changes and modifications may be effected therein by one skilled in the art without departing from the scope or spirit of the invention.

What is claimed is:

1. In an optical detector for sensing the strength of an external optical wave comprising:
    a multiplicity of electrodes spaced in a substantially regular pattern, the multiplicity of electrodes adapted to resonantly couple between the external optical wave and a local optical wave and to allow a potential difference between adjacent electrodes, wherein the multiplicity of electrodes comprise a metal; and
    a structure associated with the multiplicity of electrodes, wherein the structure and the multiplicity of electrodes support the local wave, the improvement comprising:
    a substrate comprising a semiconductor in superposed relationship with the electrodes; and
    an aspect ratio of at least 1 of a height of the multiplicity of electrodes to a spacing between adjacent electrodes,
    wherein the local wave comprises a surface plasmon wave having a component of momentum oriented substantially perpendicular to a detector surface.

2. The optical detector of claim 1, wherein the spacing is at least about 20 nanometers.

3. The optical detector of claim 1, wherein the aspect ratio is at least 3.

4. The optical detector of claim 1, wherein the aspect ratio is substantially in a range greater than about 4 and less than about 16.

5. The optical detector of claim 1, wherein the aspect ratio is substantially in a range greater than about 10 and less than about 15.

6. The optical detector of claim 1, wherein the substrate comprises one of mercury cadmium telluride, indium gallium arsenide, and silicon.

7. The optical detector of claim 1, wherein the substrate comprises a silicon-on-insulator structures.

8. The optical detector of claim 1, further comprising:
    a second multiplicity of electrodes spaced in a substantially regular pattern rotated 90° in the plane of the detector surface, the second multiplicity of electrodes being in superposed relationship with the multiplicity of electrodes and the substrate, wherein the second multiplicity of electrodes are adapted to resonantly couple between the external optical wave and the surface plasmon wave, the surface plasmon wave having a component of momentum oriented substantially perpendicular to the detector surface.

9. The optical detector of claim 1, further comprising a semiconductor layer substantially filling the spacing between adjacent electrodes.

10. The optical detector of claim 1, wherein the height of the multiplicity of electrodes is at least about 50 nanometers.

11. The optical detector of claim 1, wherein the height of the multiplicity of electrodes is substantially in a range of about 50 nanometers to about 1500 nanometers.

12. The optical detector of claim 1, wherein the height of the multiplicity of electrodes is substantially in a range of about 100 nanometers to about 750 nanometers.

13. An optical device for sensing the strength of an incident optical wave within a wavelength range, comprising:
    a first array of first electrodes, the first array comprising a first contact window having a first width, a first contact window dielectric having a first dielectric constant, a first contact thickness and a first contact width;
    a second array of second electrodes, the second array comprising a second contact window having a second width, a second contact window dielectric having a second dielectric constant, a second contact thickness and a second contact width, wherein the second array is linearly displaced relative to the first array, the second electrodes being interdigitated with the first electrodes, the device further comprising a pitch;
    a structure associated with the first array and the second array for resonantly coupling between the incident optical wave and a local electromagnetic resonance, the electromagnetic resonance comprising at least a cavity mode of a local surface plasmon wave; and
    a substrate, the structure comprising the first array and the second array being in superposed relationship with the substrate.

14. The optical device of claim 13, wherein the substrate comprises one of an elemental IV semiconductor, a III-V semiconductor, and a II-VI semiconductor.

15. The optical device of claim 14, wherein the substrate comprises one of mercury cadmium telluride, indium gallium arsenide, and silicon.

16. The optical device of claim 15, wherein the substrate comprises mercury cadmium telluride, wherein the first electrodes and the second electrodes comprise aluminum, wherein the first dielectric constant is in a range of from 1.75 to 4.0, and wherein the first dielectric constant is greater than the second dielectric constant.

17. The optical device of claim 16, the structure resonantly coupling with a hybrid mode, the hybrid mode comprising at least the cavity mode and a horizontal surface plasmon mode, wherein the wavelength range comprises a range from at least about 2.0 micrometers to about 4.0 micrometers.

18. The optical device of claim 16, the structure resonantly coupling with a hybrid mode, wherein the wavelength range comprises a range from at least 4.0 micrometers to about 15 micrometers, wherein each of the first and the second width is in a range from 0.5 micrometers to 0.9 micrometers, wherein each of the first contact thickness and the second contact thickness is in a range of from 0.45 micrometers to 0.85 micrometers, and wherein each of the first contact width and the second contact width is in a range of from 0.2 micrometers to 0.5 micrometers.

19. The optical device of claim 14, wherein the substrate comprises silicon, the structure resonantly coupling with a hybrid mode, the hybrid mode comprising at least the cavity mode and a horizontal surface plasmon mode, the wavelength range comprising a range from about 830 nanometers to at least about 850 nanometers, further wherein each of the first contact width and the second contact width is greater than each of the first width and the second width.

20. The optical device of claim 19, wherein the first electrodes and the second electrodes comprise gold, wherein the first dielectric constant is in a range from 1.75 to 4.0, and wherein the first dielectric constant is greater than the second dielectric constant.

21. The optical device of claim 20, wherein each of the first contact thickness and the second contact thickness is within a range of from 0.075 to 0.2 micrometers.

22. The optical device of claim 20, wherein each of the first and the second width is within a range of 0.075 micrometers to 0.25 micrometers.

23. The optical device of claim 14, wherein the substrate comprises a silicon-on-insulator structure.

24. The optical device of claim 14, wherein the substrate comprises silicon, wherein the second dielectric constant is greater than the first dielectric constant, and wherein each of the first contact width and the second contact width is greater than the first width and the second width.

25. The optical device of claim 24, wherein the first electrode and the second electrode comprise a metal, and wherein at least one of the first contact thickness and the second contact thickness is at least 100 nm.

26. The optical device of claim 24, wherein the second dielectric constant is in a range of from 1.75 to 4.0.

27. The optical device of claim 25, wherein the first contact width is at least twice the first width, and wherein the first contact width is within a range from about 0.2 micrometers to about 0.4 micrometers.

28. The optical device of claim 23, comprising at least 0.25 A/W responsivity and a bandwidth of at least 30 GHz, within an operating wavelength range of 830 nm to 850 nm.

29. The optical device of claim 23, wherein the second dielectric constant is greater than the first dielectric constant, wherein the first contact width is greater than the first width.

30. The optical device of claim 23, wherein the second dielectric is silicon oxide, wherein the first contact width is at least twice the first width, and wherein each of the first thickness and the second thickness is at least 100 nm.

31. The optical device of claim 30, the substrate comprising a top silicon layer and an insulator layer, wherein the top silicon layer is within a range from about 300 nanometers to about 400 nm, and wherein the insulator layer is within a range from about 25 nm to about 75 nm.

* * * * *

UNITED STATES PATENT AND TRADEMARK OFFICE
CERTIFICATE OF CORRECTION

PATENT NO.         : 7,423,254 B2                          Page 1 of 1
APPLICATION NO.    : 10/593930
DATED              : September 9, 2008
INVENTOR(S)        : Arend et al.

It is certified that error appears in the above-identified patent and that said Letters Patent is hereby corrected as shown below:

Column 8, line 47

Now reads:    "1000 m"

Should read:    -- 1000 nm --

Column 13, line 16

Now reads:    "electrodes 12"

Should read:    -- electrodes 112 --

Column 17, line 26

Now reads:    "surface plasmon in prior art"

Should read:    -- surface plasmon resonance in prior art --

Column 22, line 53

Now reads:    "dielectrics were Me same"

Should read:    -- dielectrics were the same --

Signed and Sealed this

Fourteenth Day of April, 2009

JOHN DOLL
*Acting Director of the United States Patent and Trademark Office*